(12) United States Patent
Horii

(10) Patent No.: US 8,446,771 B2
(45) Date of Patent: May 21, 2013

(54) NAND NONVOLATILE SEMICONDUCTOR MEMORY DEVICE AND WRITE METHOD FOR NAND NONVOLATILE SEMICONDUCTOR MEMORY DEVICE

(75) Inventor: Hideto Horii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 12/881,914

(22) Filed: Sep. 14, 2010

(65) Prior Publication Data

US 2011/0222347 A1 Sep. 15, 2011

(30) Foreign Application Priority Data

Mar. 15, 2010 (JP) ................................. 2010-058126

(51) Int. Cl.
*G11C 16/04* (2006.01)

(52) U.S. Cl.
USPC ..................................................... 365/185.18

(58) Field of Classification Search
USPC ........................................ 365/185.18, 185.03
See application file for complete search history.

(56) References Cited

U.S. PATENT DOCUMENTS

| | | | |
|---|---|---|---|
| 6,657,891 B1 | 12/2003 | Shibata et al. | |
| 6,876,578 B2 | 4/2005 | Shibata et al. | |
| 6,925,004 B2 | 8/2005 | Shibata et al. | |
| 7,016,226 B2 | 3/2006 | Shibata et al. | |
| 7,120,052 B2 | 10/2006 | Shibata et al. | |
| 7,315,471 B2 | 1/2008 | Shibata et al. | |
| 7,443,724 B2 | 10/2008 | Shibata et al. | |
| 7,593,260 B2 | 9/2009 | Shibata et al. | |
| 7,782,670 B2 | 8/2010 | Shibata et al. | |
| 2009/0303791 A1 | 12/2009 | Shibata et al. | |
| 2010/0034020 A1 | 2/2010 | Tanaka et al. | |
| 2010/0321999 A1* | 12/2010 | Yoo et al. | 365/185.03 |

FOREIGN PATENT DOCUMENTS

| | | |
|---|---|---|
| JP | 2001-93288 | 4/2001 |
| JP | 2004-192789 | 7/2004 |
| JP | 2005-25898 | 1/2005 |
| JP | 2008-257781 | 10/2008 |
| JP | 4282636 | 3/2009 |
| JP | 2009-522704 | 6/2009 |

OTHER PUBLICATIONS

U.S. Appl. No. 12/837,595, filed Jul. 16, 2010, Noboru Shibata et al.
Office Action issued Aug. 7, 2012 in Japanese Application No. 2010-058126 (With English Translation).

* cited by examiner

*Primary Examiner* — Hoai V Ho
*Assistant Examiner* — Tri Hoang
(74) *Attorney, Agent, or Firm* — Oblon, Spivak, McClelland, Maier & Neustadt, L.L.P.

(57) ABSTRACT

According to one embodiment, a NAND nonvolatile semiconductor memory device comprises memory cell transistors and a write circuit. The memory cell transistors are arranged in a matrix in a column direction and in a row direction. Each of the memory cell transistors comprises a charge accumulation layer and a control gate electrode configured to control the charge accumulation state of the charge accumulation layer. The write circuit carries out write on the memory cell transistors. The memory cell transistors arranged in the same line include first memory cell transistors and second memory cell transistors that are smaller than the first memory cell transistors in the column direction. The write circuit carries out write on a predetermined first memory cell transistor and then on another first memory cell transistor. After the write on the another first memory cell transistor, the write circuit carries out write on the second memory cell transistor.

13 Claims, 19 Drawing Sheets

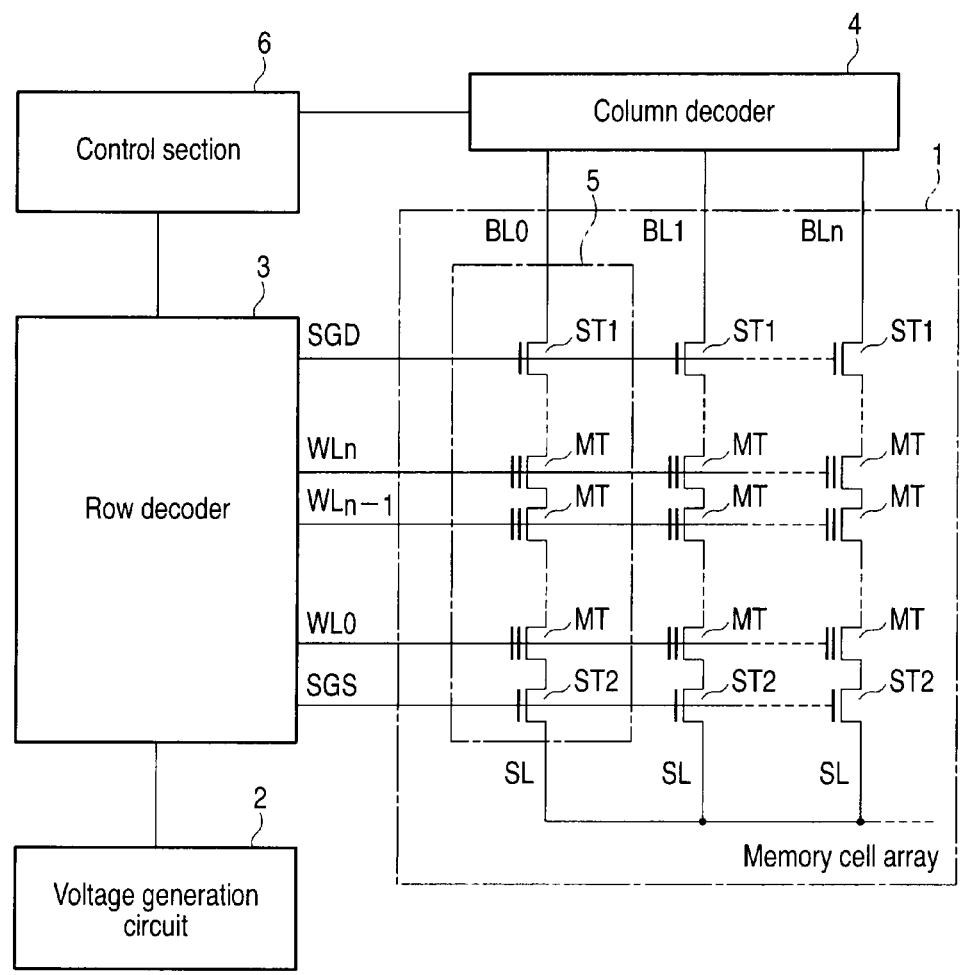
F I G. 1

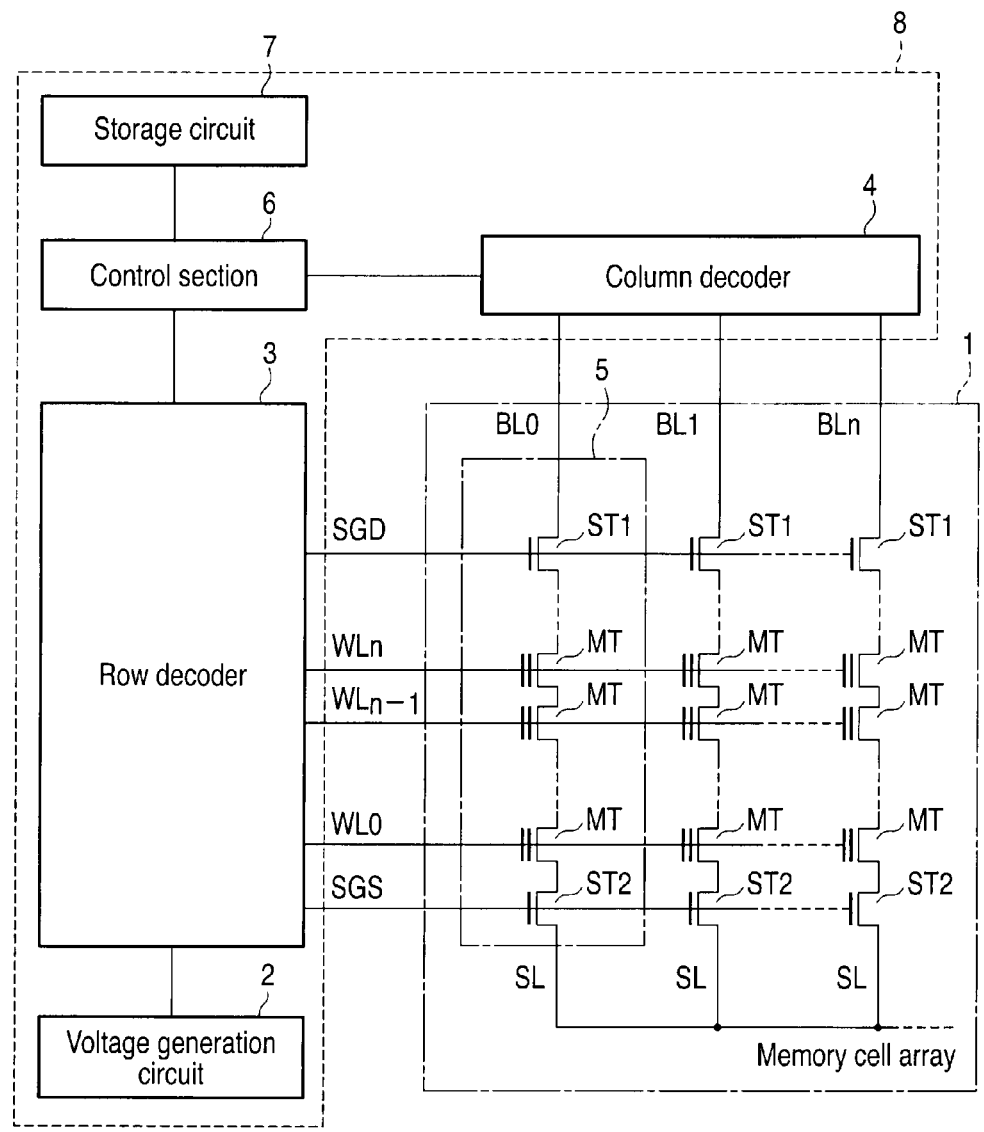
F I G. 6

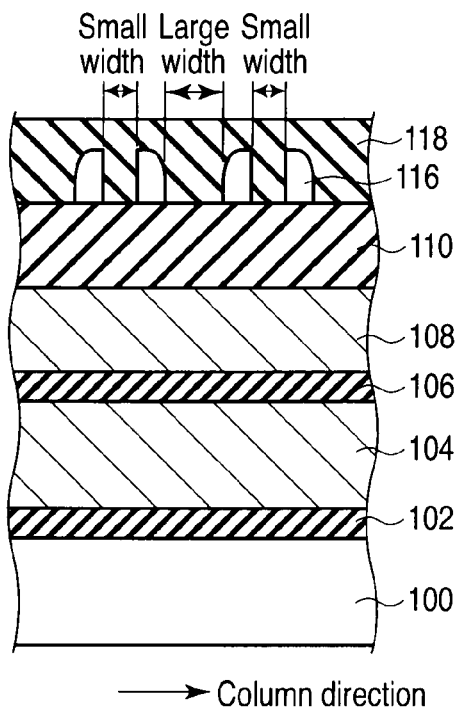
F I G. 10
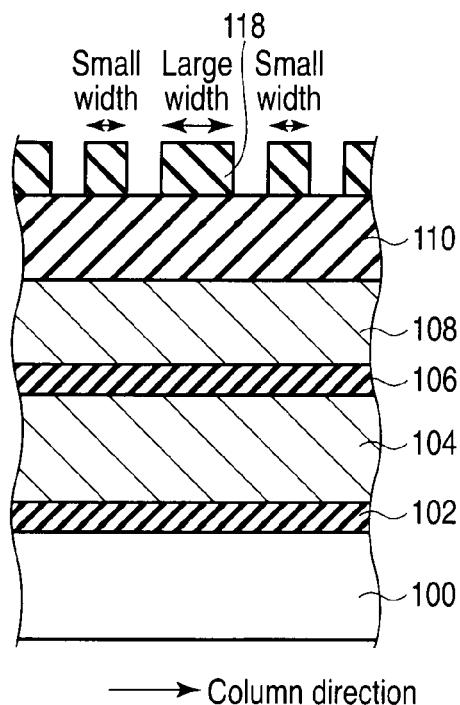
F I G. 11

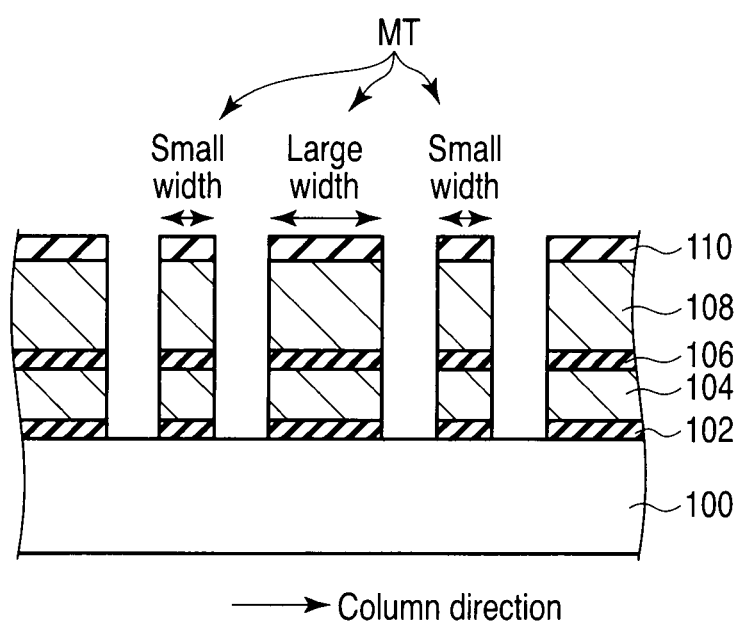
F I G. 12

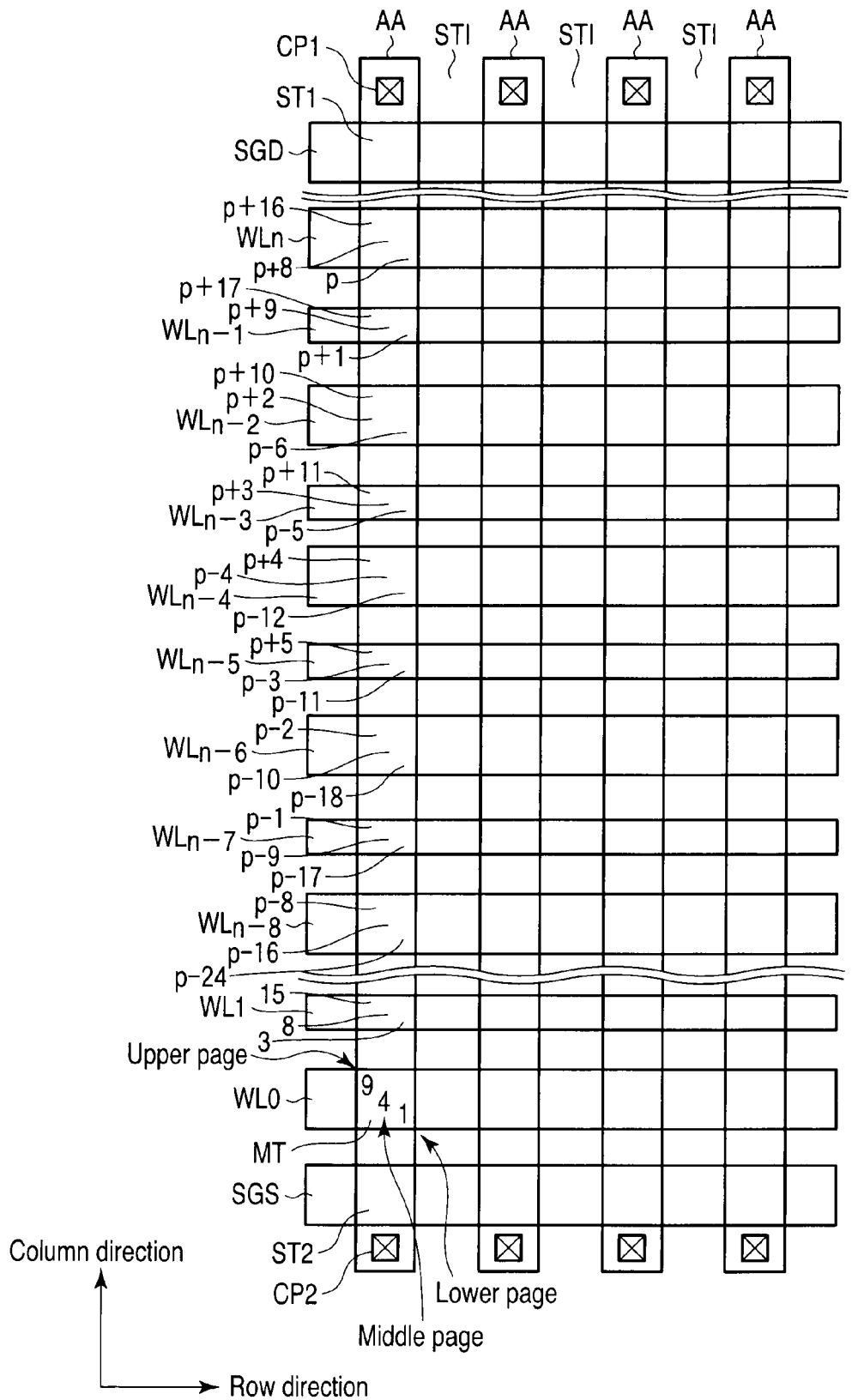
F I G. 14

NAND NONVOLATILE SEMICONDUCTOR MEMORY DEVICE AND WRITE METHOD FOR NAND NONVOLATILE SEMICONDUCTOR MEMORY DEVICE

CROSS-REFERENCE TO RELATED APPLICATIONS

This application is based upon and claims the benefit of priority from Japanese Patent Application No. 2010-058126, filed Mar. 15, 2010; the entire contents of which are incorporated herein by reference.

FIELD

Embodiments described herein relate generally to a NAND nonvolatile semiconductor memory device and a write method for the NAND nonvolatile semiconductor memory device.

BACKGROUND

The required capacity of NAND nonvolatile semiconductor memory devices (memories) has been increasing. Efforts have been made to reduce the size of elements in order to increase the capacity of memories. Thus, a sidewall transfer process has frequently been adopted. However, the sidewall transfer process may result in a difference in size between the area between sidewalls between which a core material is sandwiched and the area between sidewalls between which a space is sandwiched. When the area between the sidewalls is processed so as to finally form an active area (AAs) or a control gate electrode (CGs), memory transistors (memory cells) each with a thick AA or CG and a thick charge accumulation layer are formed alternately with memory transistors each with a thin AA or CG and a thin charge accumulation layer. In this case, the impact of inter-cell interference varies among the memory cell transistors. Thus, an increase in variation in threshold during read may result from adoption of a conventional programming scheme such as a lower middle (LM) scheme described in Jpn. Pat. Appln. KOKAI Publication No. 2001-93288. When programming is adapted to suppress a variation in threshold, programming speed cannot disadvantageously be increased.

BRIEF DESCRIPTION OF THE DRAWINGS

FIG. 1 is a block diagram schematically showing the configuration of a NAND nonvolatile semiconductor memory device according to a comparative example of embodiments;

FIG. 6 is a block diagram schematically showing the configuration of a NAND nonvolatile semiconductor memory device according to a first embodiment;

FIG. 8 to FIG. 12 are sectional views of the basic method for manufacturing the NAND nonvolatile semiconductor memory device according to the first embodiment;

FIG. 14 is a plan view schematically showing a basic programming order for the NAND nonvolatile semiconductor memory device according to Modification 2 of the first embodiment;

DETAILED DESCRIPTION

In general, according to one embodiment, a NAND nonvolatile semiconductor memory device comprises a plurality of memory cell transistors and a write circuit. The plurality of memory cell transistors are arranged in a matrix in a column direction and in a row direction. Each of the memory cell transistors comprises a charge accumulation layer and a control gate electrode configured to control the charge accumulation state of the charge accumulation layer. The write circuit carries out write on the plurality of memory cell transistors. The memory cell transistors arranged in the same line include first memory cell transistors and second memory cell transistors that are smaller in size than the first memory cell transistors along the line. The write circuit carries out write on a predetermined first memory cell transistor and then on another first memory cell transistor. After the write on the another first memory cell transistor, the write circuit carries out write on the second memory cell transistor.

Embodiments will be described below in detail with reference to the drawings.

Figure 2:
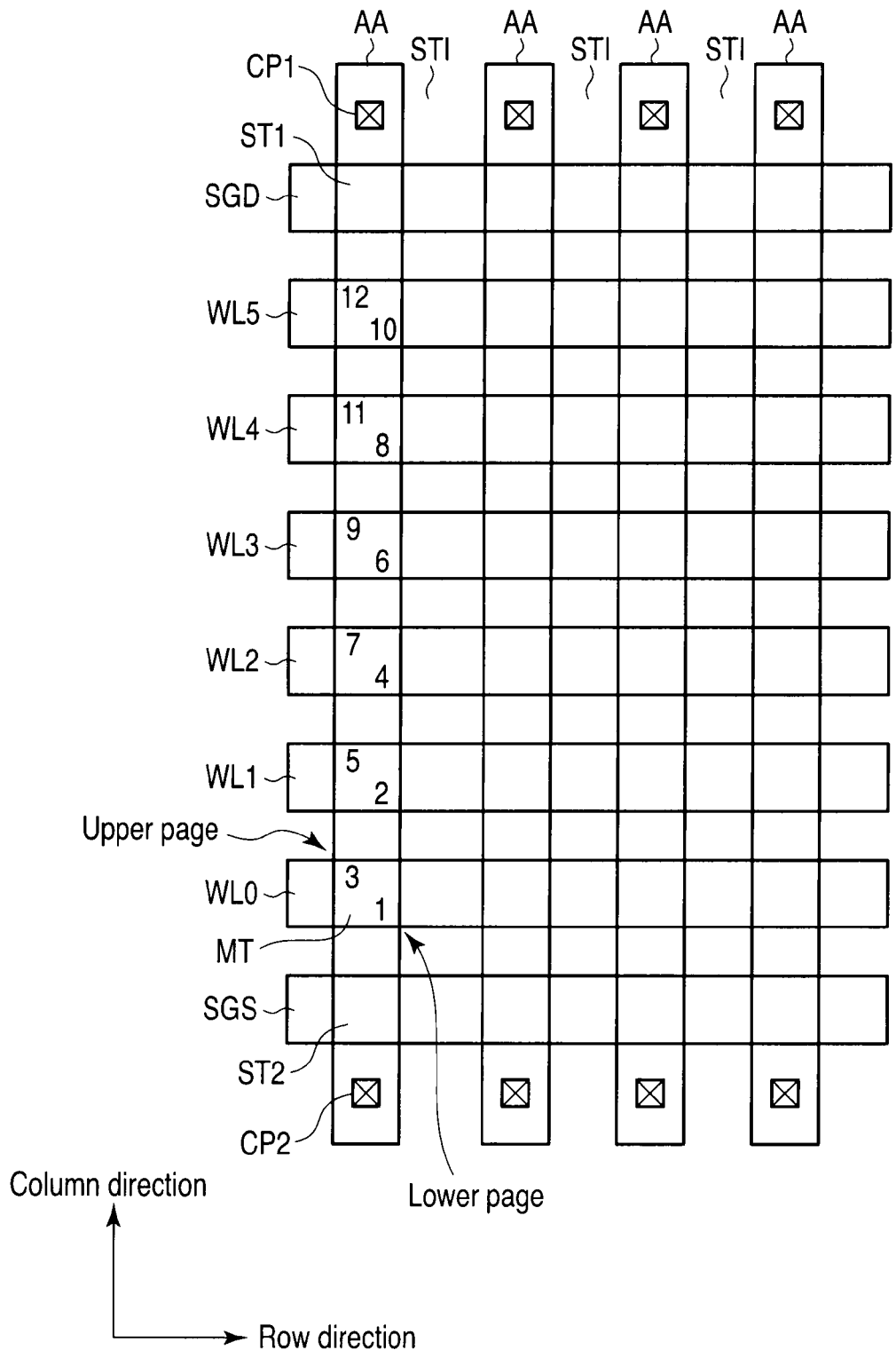
FIG. 2 to FIG. 4 are plan views schematically showing a basic programming order for the NAND nonvolatile semiconductor memory device according to the comparative example of the embodiments.
Figure 3:
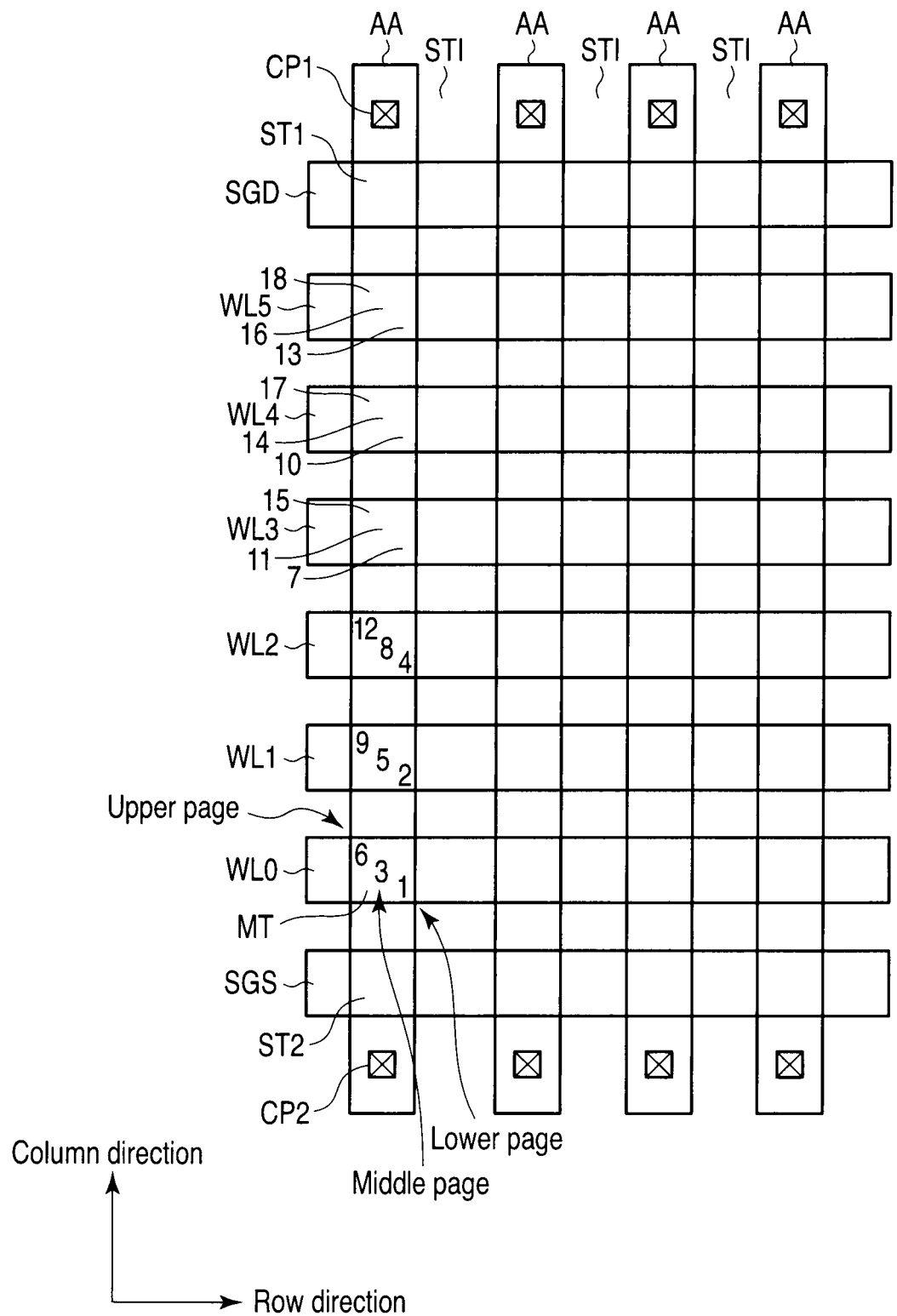
Figure 4:
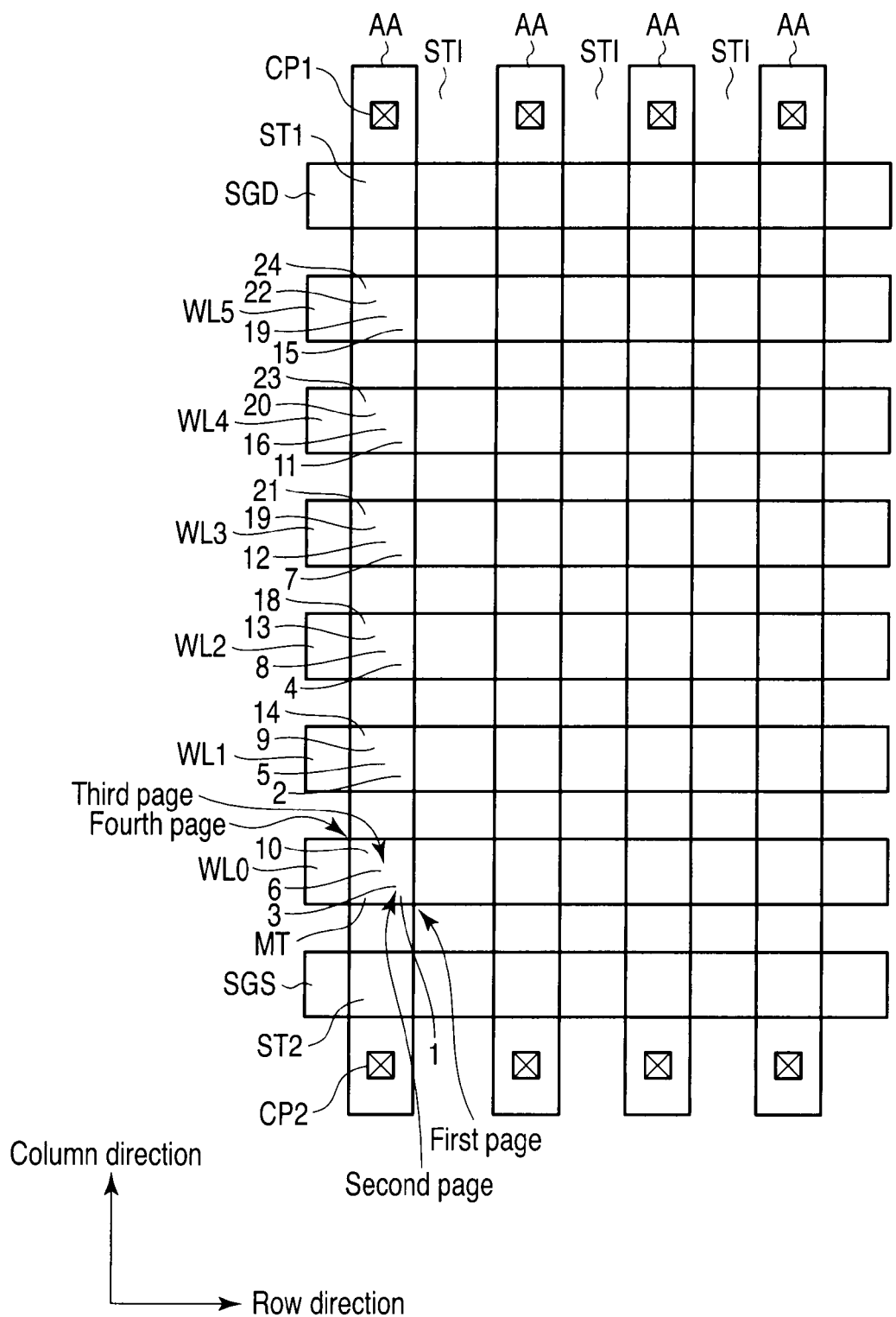
Figure 5:
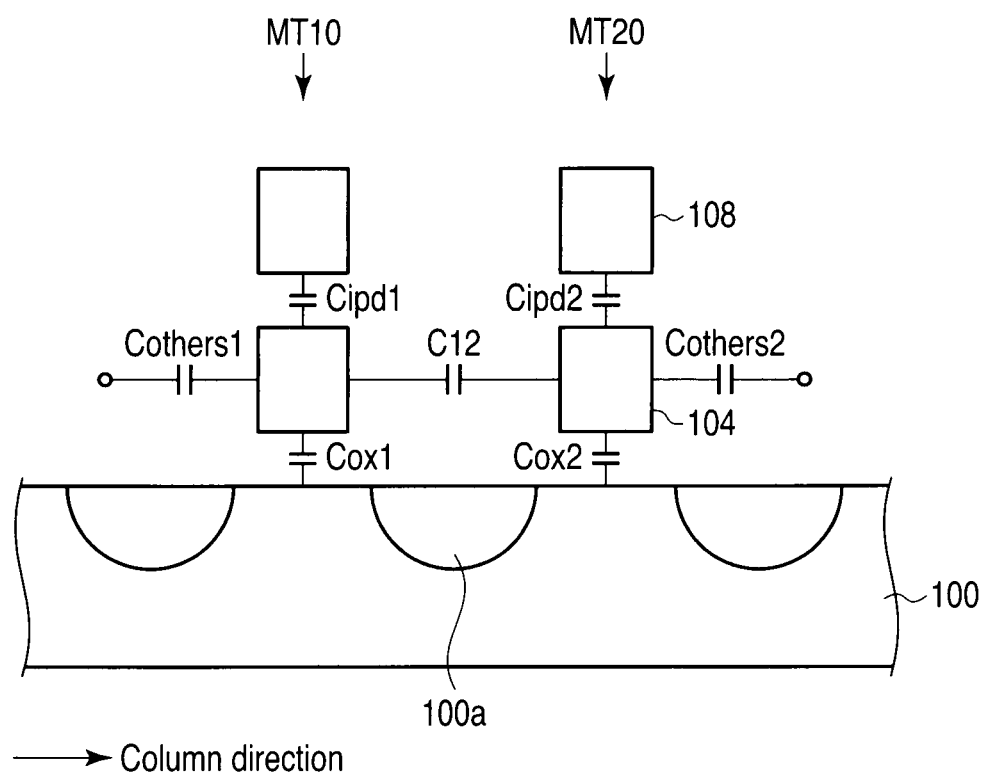
FIG. 5 is a sectional view schematically showing two memory cell transistors according to the comparative example of the embodiments.

First, a comparative example of the embodiments will be described with reference to FIG. 1 to FIG. 5. FIG. 1 is a block diagram schematically showing the configuration of a NAND nonvolatile semiconductor memory device according to the comparative example of the embodiments. FIG. 2 to FIG. 4 are plan view schematically showing a basic programming order for the NAND nonvolatile semiconductor memory device according to the comparative example of the embodiments. FIG. 5 is a diagram schematically showing two memory cell transistors MT according to the comparative example of the embodiments.

As shown in FIG. 1, the NAND nonvolatile semiconductor memory device comprises a memory cell array 1, a voltage generation circuit 2, a row decoder 3, a column decoder 4, and a control section 6. First, the memory cell array 1 will be described.

As shown in FIG. 1, the memory cell array 1 comprises a plurality of NAND columns 5 in each of which a plurality of nonvolatile memory cell transistors (memory cells) MT are connected together in series in the column direction. Each of the NAND columns 5 comprises a plurality of memory cell transistors MT, and select transistors ST1 and ST2. The memory cell transistor MT comprises a charge accumulation layer (not shown in the drawings) formed on a semiconductor substrate via a tunnel insulating film (not shown in the drawings) and an insulating film (hereinafter referred to as a inter-electrode insulating film; not shown in the drawings) formed on the charge accumulation layer and having a higher dielectric constant than the charge accumulation layer, and further comprises a control gate electrode (hereinafter referred to as a CG; not shown in the drawings) formed on the inter-electrode insulating film. Multiple values can be written to the memory cell transistor MT. Furthermore, the number of the memory cell transistors MT which are connected together in series may be 8, 16, 32, 64, 128, or 256, and is not particularly limited. Additionally, the adjacent memory cell transistors MT share a source and a drain. The memory cell transistors MT are arranged such that current paths in the memory cell transistors MT are connected together in series between the select transistors ST1 and ST2. A drain area of one of the plurality of series connected memory cell transistors which is located at one end of the arrangement of the memory cell transistors is connected to a source area of the select transistor ST1. A source area of one of the plurality of series connected memory cell transistors located at the other end of the arrangement is connected to a drain area of the select transistor ST2.

The memory cell transistors MT in the same row are all connected to one word line WLi (i is an integer). Gate electrodes of the select transistors ST1 and ST2 for the memory cells in the same row are all connected to select gate lines SGD and SGS, respectively. For simplification of description, when the word lines WLi are not distinguished from one another, the word lines may be called the word lines WL. Furthermore, drains of the select transistors ST1 in the same column in the memory cell array 1 are all connected to one of bit lines BLj (j is an integer). When the bit lines BLj are not distinguished from one another, the bit lines are called the bit lines BL. Sources of the select transistors ST2 are all connected to a source line SL.

A plurality of NAND columns 5 are provided in the memory cell array 1. The NAND columns 5 in the same column are all connected to the same bit line BL. Furthermore, data is written to the plurality of memory cell transistors MT connected to the same word line WL at a time. This unit is called a page. Moreover, data is erased from the plurality of NAND columns 5 which are located in the row direction and share the plurality of word lines WL at a time. This unit is called a memory block.

The row decoder 3 selects any of the word lines WL in the memory cell array 1 and applies a voltage to the selected word line WL.

The column decoder 4 selects any of the bit lines BL in the memory cell array 1.

The voltage generation circuit 2 generates and supplies a voltage to the row decoder 3.

The voltage generation circuit 2, the row decoder 3, and the column decoder 4 each comprise a low-withstand-voltage MOS transistor that uses, for example, a voltage VDD (for example, 1.5 V) as a driving voltage and a high-withstand-voltage MOS transistor that uses, for example, a voltage VPP (for example, 20 V) higher than a power supply voltage for the low-withstand-voltage MOS transistor, as a driving voltage.

The control section 6 controls the operation of the NAND nonvolatile semiconductor memory device. That is, the control section 6 executes the operational sequence of a data write operation, a data read operation, and a data erase operation based on an address and a command provided by a host (not shown in the drawings). Specifically, the control section 6 controls timings at which the voltage generation circuit 2 outputs a voltage. The control section 6 then generates a block select signal and a column select signal based on the addresses and the operational sequence. The control section 6 outputs the block select signal to the row decoder 3 and outputs the column select signal to the column decoder 4.

As shown in FIG. 2 to FIG. 4, for example, a plurality of striped element areas AA extending in the column direction (AA direction) are provided on a p-type semiconductor substrate along the row direction, which is orthogonal to the column direction. An isolation area ST1 extending in the column direction is formed between the adjacent element areas AA. The isolation area ST1 electrically separates the adjacent element areas AA from each other. Striped word lines WL and select gate lines SGD and SGS extending in the row direction (word line WL direction) are formed on the p-type semiconductor substrate so as to stride over the plurality of element areas AA. The memory cell transistor MT is provided in an area where the word line WL intersects the element area AA. The select transistor ST1 is provided in an area where the select gate line SGD intersects the element area AA. The select transistor ST2 is provided in an area where the select gate line SGS intersects the element area AA. In the element area AA between the word lines WL adjacent to each other in the column direction and in the element area AA between the word line WL and each of the select gate lines SGD and SGS, an impurity diffusion layer is provided which forms a source area or a drain area of each of the memory cell transistor MT and the select transistors ST1 and ST2.

An impurity diffusion layer formed in the element area AA of the select transistor ST1 and which is adjacent to no memory cell transistor MT in the column direction functions as the drain area of the select transistor ST1. A contact plug CP1 is formed over the drain area. The contact plug CP1 is connected to one of the striped bit lines BL (not shown in the drawings) provided in the column direction. Furthermore, an impurity diffusion layer formed in the element area AA of the select transistor ST2 and which is adjacent to no memory cell transistor MT in the column direction functions as the source area of the select transistor ST2. A contact plug CP2 is formed over the source area. The contact plug CP2 is connected to the source line SL (not shown in the drawings).

Furthermore, as shown in FIG. 2 to FIG. 4, in the NAND nonvolatile semiconductor memory device, programming is sequentially performed from the source-side memory cell transistor MT to the drain-side memory cell transistor MT in the NAND column 5. The programming method is a conventional lower middle (LM) scheme with inter-cell interference effect taken into account. For simplification, FIG. 2 to FIG. 4 show the programming order in one NAND column 5.

FIG. 2 shows that each memory cell transistor stores four values (2 bits). In FIG. 2, the right number in the memory cell transistor MT indicates a turn programming a lower page. The left number in the memory cell transistor MT indicates a turn programming an upper page.

Furthermore, FIG. 3 shows that each memory cell transistor stores eight values (3 bits). In FIG. 3, the right number in the memory cell transistor MT indicates a turn programming a lower page. The middle number in the memory cell transistor MT indicates a turn programming a middle page. The left number in the memory cell transistor MT indicates a turn programming an upper page.

Moreover, FIG. 4 shows that each memory cell transistor stores 16 values (4 bits). In FIG. 4, the rightmost number in the memory cell transistor MT shows a turn programming a first page. The second number in the memory cell transistor MT from the right end shows a turn programming a second page. The third number in the memory cell transistor MT from the right end shows a turn programming a third page. The fourth number in the memory cell transistor MT from the right end shows a turn programming a fourth page.

Now, a variation in threshold caused by capacitive coupling between charge accumulation layers, which is an inter-cell interference effect will be described with reference to FIG. 5. FIG. 5 is a sectional view of the center of the bit line for the two memory cell transistors MT taken along the direction of the bit line BL.

As shown in FIG. 5, the two memory cell transistors MT are defined as memory cell transistors MT10 and MT20. Each of the memory cell transistors MT10 and MT20 comprises a tunnel insulating layer OX (not shown in the drawings) formed on a semiconductor substrate, a charge accumulation layer 104 formed on the tunnel insulating layer, an inter-electrode insulating layer (not shown in the drawings) formed on the charge accumulation layer 104 and which has a higher dielectric constant than the charge accumulation layer 104, and CG 108 formed on the inter-electrode insulating film. Furthermore, the memory cell transistors MT10 and MT20 are electrically connected together by an impurity diffusion area (source/drain area) 100a formed in the semiconductor substrate 100. Here, reference numeral Cipd1 denotes the IPD capacity of the memory cell transistor MT10. Reference numeral Cox1 denotes the tunnel oxide film capacity of the memory cell transistor MT10. Reference numeral Cipd2 denotes the IPD capacity of the memory cell transistor MT20. Reference numeral Cox2 denotes the tunnel oxide film capacity of the memory cell transistor MT20. Reference numeral C12 denotes the capacity between the memory cell transistors MT10 and MT20. Reference numeral Cothers1 denotes the total capacity of the memory cell transistor MT10 from which Cipd1, Cox1, and C12 are subtracted. Reference numeral Cothers2 denotes the total capacity of the memory cell transistor MT20 from which Cipd2, Cox2, and C12 are subtracted.

For example, the memory cell transistor MT10 has already been programmed. The memory cell transistor MT20 is to be programmed. When the memory cell transistor MT20 is programmed to increase the voltage of the memory cell transistor MT20 by dQ2 (<0), a threshold variation dVth1 in the memory cell transistor MT10 is expressed by:

$$dVth1 = -\{C12/(Cipd2+Cox2+Cothers2+C12)Cipd1\}dQ2 \quad \text{(Expression 1)}$$

A threshold variation dVth2 in the memory cell transistor is expressed by:

$$dVth2 = -dQ2/Cipd2 \quad \text{(Expression 2)}$$

Thus, when programming causes an increase in the threshold of the memory cell transistor MT20 by dVTh2, the threshold of the memory cell transistor MT10 varies by:

$$dVth1 = \{C12/(Cipd2+Cox2+Cothers2+C12)\}(Cipd2/Cipd1)dVth2 \quad \text{(Expression 3)}$$

Here, if the size of the memory cell transistor MT (for example, the width sizes of CG and the charge accumulation layer in the column direction) varies among the memory cell transistors MT and the memory cell transistor MT10 is larger than the memory cell transistor MT20, then Cipd1>Cipd2 and Cox1>Cox2. In this case, the threshold of the memory cell transistor MT10 varies more insignificantly than if the memory cell transistor MT10 is smaller than the memory cell transistor MT20.

Thus, the following problem results. It is assumed that the size of the memory cell transistor MT varies among the memory cell transistors MT and that the memory cell transistor MT in which CG and the charge accumulation layer have a large width (the width is hereinafter referred to as a CG width) (a large CG width) is adjacent to the memory cell transistor MT in which CG and the charge accumulation layer have a small width (a small CG width). Then, when the memory cell transistor MT with the small CG width is programmed earlier than the memory cell transistor MT with the large CG width, the memory cell transistor with the small CG width is subjected to a significant inter-cell interference effect.

(First Embodiment)

Now, a first embodiment will be described with reference to FIG. 6 to FIG. 12. In the description of the comparative example, programming is performed according to the LM scheme. In the description of a first embodiment, in a NAND nonvolatile semiconductor memory device comprising memory cell transistors with a large CG width (large CD size) and memory cell transistors with a small CG width (small CD size), the memory cell transistors MT with the large CG width are preferentially programmed. The CG width (CG size) corresponds to the gate length of the memory cell transistor MT.

Figure 7:
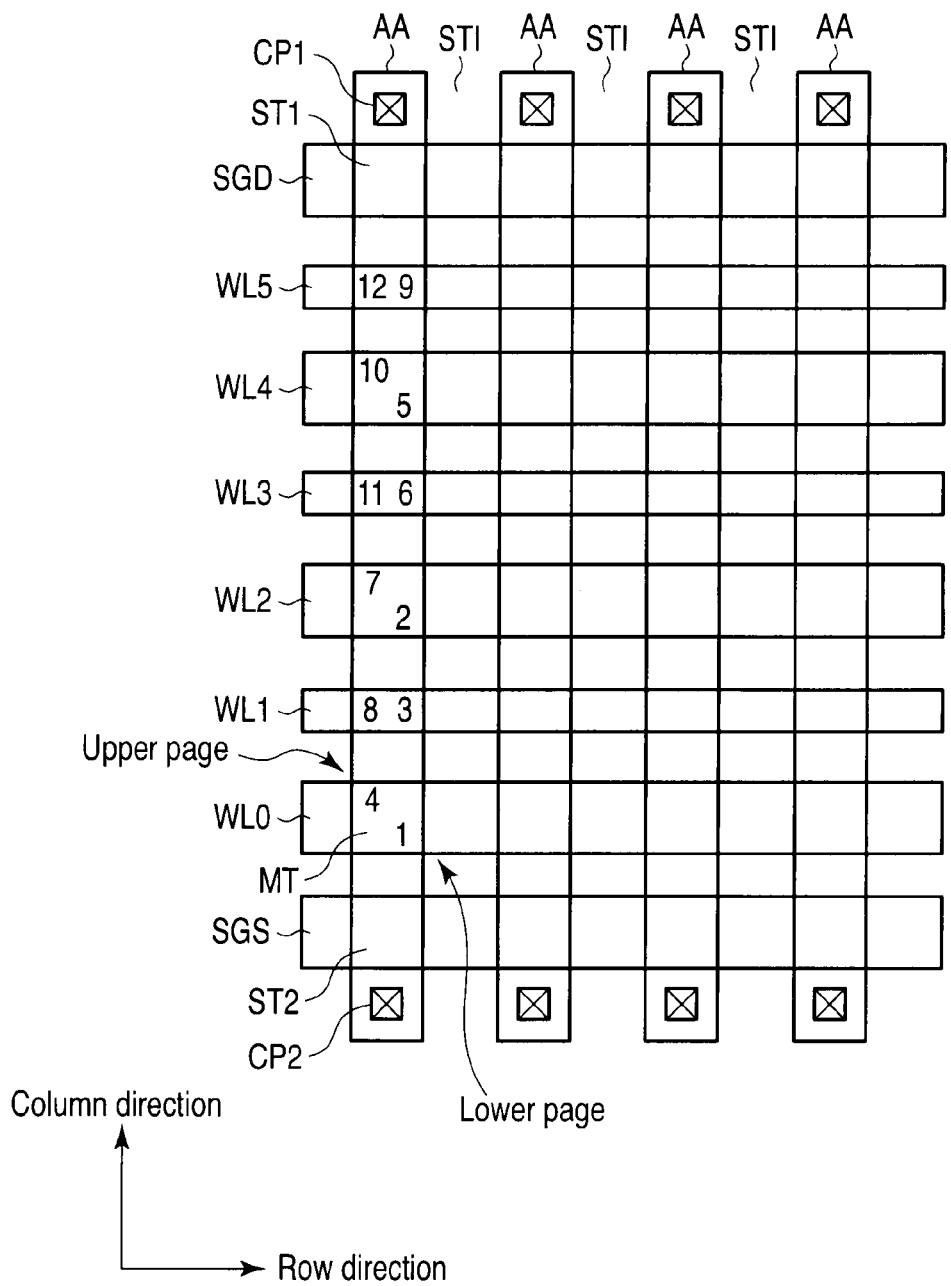
FIG. 7 is plan views schematically showing a basic programming order for the NAND nonvolatile semiconductor memory device according to the first embodiment.

FIG. 6 is a block diagram schematically showing the configuration of a NAND nonvolatile semiconductor memory device according the first embodiment. FIG. 7 is a plan view schematically showing a basic programming order for the NAND nonvolatile semiconductor memory device according to the first embodiment. The NAND nonvolatile semiconductor memory device according to the first embodiment has a basic configuration similar to that in the above-described comparative example. Thus, matters described above in the comparative example and matters that can be easily analogized from the comparative example will not be described below.

As shown in FIG. 6, the NAND nonvolatile semiconductor memory device according the first embodiment comprises a memory cell array 1, a voltage generation circuit 2, a row decoder 3, a column decoder 4, a control section 6, and a storage circuit 7. In the embodiments, the voltage generation circuit 2, the row decoder 3, the column decoder 4, the control section 6, and the storage circuit 7 are collectively referred to as a write circuit 8.

The storage circuit 7 can store dimensional information on the memory cell transistors MT. Furthermore, the programming order may be set for periods for the memory cell transistors MT with a large CG width and periods for memory cell transistors MT with a small CG width. Specifically, write is carried out on a memory cell array 1. Based on write characteristics, the difference in size between the memory cell transistors MT is determined. Then, the memory cell transistors MT are classified into, for example, two types, that is, the memory cell transistors MT with the large CG width and the memory cell transistors MT with the small CG width. Classification information on the memory cell transistors MT is stored in the storage circuit 7 as dimensional information (binary information). It is assumed that high-speed write can be carried out on the memory cell transistors MT with a high threshold (a large CG width size) and that only low-speed write can be carried out on the memory cell transistors MT with a low threshold (a small CG width size). In this case, after data is erased from all the memory cell transistors MT, a predetermined number of write pulses are applied to the memory cell transistors MT starting with the source-side one. The thresholds of the memory cell transistors MT are then read and stored in the storage circuit 7 as dimensional information on the memory cell transistors MT. The periods for the memory cell transistors with the large CG width and the memory cell transistors with the small CG width can be derived from the dimensional information. Based on the periods, one of the programming orders corresponding to preset periods is selected. The selected programming order can then be adapted for the programming of the memory cell array 1. The information or the periods are used to determine a write order.

In the NAND nonvolatile semiconductor memory device shown in FIG. 7, in the column direction, the memory cell transistor MT located at the intersection between AA and each of word lines WL0, WL2, and WL4 has a larger CG width than the that located at the intersection between AA and each of word lines WL1, WL3, and WL5. That is, the memory cell transistors MT with the large CG width and the memory cell transistors MT with the small CG width are alternately (periodically) arranged from a select transistor ST2 side (source side) to a select transistor ST1 side (drain side).

Furthermore, in the row direction (the direction of the word lines WL), the width of AA does not vary. That is, in the word line WL direction, the width of AA does not vary among the memory cell transistors MT. For simplification, a NAND column 5 is assumed to comprise six memory cell transistors MT.

In the NAND nonvolatile semiconductor memory device, programming is sequentially performed from the source-side memory cell transistor MT toward the drain-side memory cell transistor MT in the NAND column 5. The programming order is determined based on dimensional information on the memory cell transistor MT stored in the storage circuit 7. In FIG. 7, the right number in the memory cell transistor MT indicates a turn programming a lower page. The left number in the memory cell transistor MT indicates a turn programming an upper page.

First, the data in the lower page is written to the memory cell transistor MT (belonging to the word line WL0) having the large CG width and located closest to the source line side (first write). Then, the data in the lower page is written to the memory cell transistor MT (belonging to the word line WL2) having the large CG width and to which the data in the lower page has not been written and which is located on the drain side of and adjacent to the memory cell transistor MT (belonging to the word line WL1) having the small CG width and to which the data in the lower page has not been written and which is located on the drain side of and adjacent to the memory cell transistor MT belonging to the word line WL0 and to which the data in the lower page has been written (second write). Thereafter, the data in the lower page is written to the memory cell transistor MT belonging to the word line WL1 and having the small CG width and to which the data in the lower page has not been written and which is located between the memory cell transistors MT belonging to the word lines WL0 and WL2, respectively (third write).

Then, after the data in the lower page is written to the memory cell transistor MT (belonging to the word line WL1) with the small CG width, the data in the upper page is written to the memory cell transistor MT belonging to the word line WL0 and having the large CG width (fourth write). Then, the data in the lower page is written to the memory cell transistor MT (belonging to the word line WL4) having the large CG width and to which the lower page data has not been written and which is located on the drain side of and adjacent to the memory cell transistor MT (belonging to the word line WL3) having the small CG width and to which the lower page data has not been written and which is located on the drain side of and adjacent to the memory cell transistor MT belonging to the word line WL2 and having the large CG width and to which the lower page data has been written (fifth write). Thereafter, the data in the lower page is written to the memory cell transistor MT belonging to the word line WL3 and having the small CG width and to which the data in the lower page has not been written and which is located between the memory cell transistors MT belonging to the word lines WL2 and WL4, respectively (sixth write).

Then, the data in the upper page is written to the memory cell transistor MT belonging to the word line WL2 and having the large CG width (seventh write). Thereafter, the data in the upper page is written to the memory cell transistor MT belonging to the word line WL1 and having the small CG width and to which the data in the upper page has not been written and which is located between the memory cell transistors MT belonging to the word lines WL0 and WL2, respectively (eighth write). Then, the data in the lower page is written to the memory cell transistor MT (belonging to the word line WL5) having the small CG width and to which the lower page data has not been written and which is located on the drain side of and adjacent to the memory cell transistor MT belonging to the word line WL4 and having the large CG width and to which the lower page data has been written (ninth write).

Then, the data in the upper page is written to the memory cell transistor MT belonging to the word line WL4 and having the large CG width (tenth write). Thereafter, the data in the upper page is written to the memory cell transistor MT belonging to the word line WL3 and having the small CG width and to which the data in the upper page has not been written and which is located between the memory cell transistors MT belonging to the word lines WL2 and WL4, respectively (eleventh write). Finally, the data in the upper page can be written to the memory cell transistor MT belonging to the word line WL5 and having the small CG width (twelfth write).

As described above, programming is preferentially performed on the memory cell transistors MT having the large CG width and located on the source and drain sides of and adjacent to the memory cell transistor MT with the small CG width. That is, after the lower page data is completely programmed in the memory cell transistor MT having the large CG width and located on the drain side of and adjacent to the memory cell transistor MT with the small CG width, programming of the lower page data in the memory cell transistor MT with the small CG width is completed. Then, after the upper page data is completely programmed in the memory cell transistor MT having the large CG width and located on the drain side of and adjacent to the memory cell transistor MT with the small CG width, programming of the upper page data in the memory cell transistor MT with the small CG width is completed.

According to the above-described first embodiment, in the column direction, the memory cell transistors MT with the large CG width are arranged alternately with the memory cell transistors MT with the small CG width. In this case, before programming, a write pulse is applied to all the memory cell transistors MT. Then, the threshold of each of the memory cell transistors is read and stored in the storage circuit 7 as dimensional information on the memory cell transistor MT. Based on the dimensional information on the memory cell transistors, the programming order for the memory cell array 1 is determined.

The programming order is such that the memory cell transistors MT with the large CG width are programmed earlier than the memory cell transistors MT with the small CG width. That is, after the adjacent memory cell transistor MT with the large CG width is completely programmed (programming of the lower or upper page), programming of the memory cell transistor MT with the small CG width is completed (programming of the lower or upper page). Specifically, write is started with the source side memory cell transistor MT with the large CG width, then carried out on another memory cell transistor MT having the large CG width and located on the drain side of the memory cell transistor MT having the large CG width and on which the write has been carried out, and then carried out on the memory cell transistor MT having the small CG width and sandwiched between the memory cell transistors MT having the large CG width and on which the write has been carried out.

Thus, the inter-cell interference effect exerted on the memory cell transistor MT with the small CG width can be suppressed. Furthermore, the inter-cell interference effect exerted on the memory cell transistor MT with the large CG width by the memory cell transistor MT with the small CG width is reduced. Thus, compared to the case in which programming is performed regardless of the cell size, the present embodiment allows the inter-cell interference effect during programming to be suppressed.

The present inventors adopted the first embodiment when the memory cell transistors had a half pitch of 32 nm. Then, the first embodiment enabled a reduction in threshold variation by 6.9% compared to the above-described comparative example.

Now, a basic method for manufacturing a NAND nonvolatile semiconductor memory device according to the embodiment will be described. FIG. 8 to FIG. 12 are sectional views of the basic method for manufacturing a NAND nonvolatile semiconductor memory device according to the embodiment; the sectional views are taken along the column direction.

Figure 8:
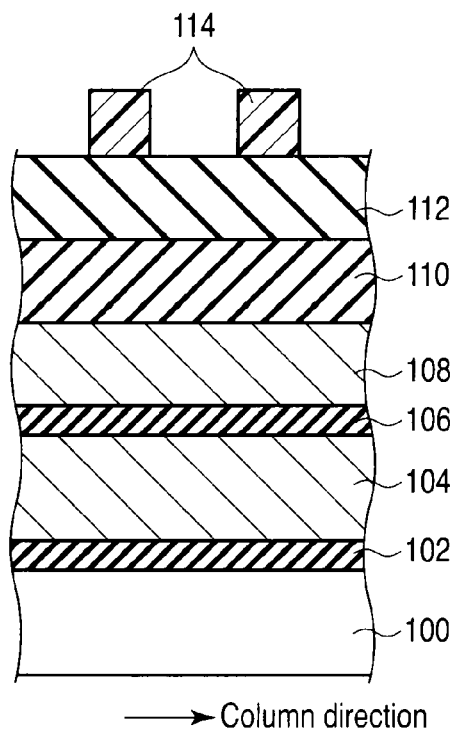

First, as shown in FIG. 8, a thermal oxide film of thickness 10 nm is formed on a semiconductor substrate (silicon substrate) 100 as a gate oxide film (tunnel insulating film) 102. A polysilicon layer of thickness 95 nm is then formed as a charge accumulation layer 104 using an LPCVD method. Then, in a nitrogen atmosphere, the surface of the charge accumulation layer 104 is plasma-nitridized into an inter-electrode insulating film (inter poly dielectric film: IPD film) 106. A silicon oxide film, a silicon nitride film, and a silicon oxide film are then formed in this order by the LPCVD method. The surface of the formed films is plasma-nitridized again. Subsequently, a polysilicon layer of thickness 100 nm is formed on the inter-electrode insulating film 106 by the LPCVD method as a control gate electrode film (CG film) 108. Then, a silicon nitride film of thickness 200 nm is formed on the CG film 108 by the LPCVD method as a mask material 110. A silicon nitride film serving as a core material 112 for a sidewall transfer process is formed on the resultant stack film. A resist pattern 114 of half pitch 64 nm is formed by lithography.

Figure 9:
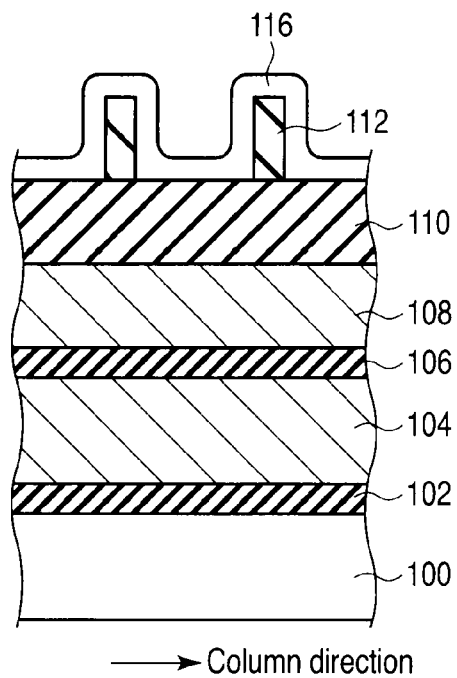

Then, as shown in FIG. 9, the core material 112 is etched by reactive ion etching (RIE) through the resist pattern 114 as a mask. Subsequently, the width of the core material 112 is reduced to 30 nm by wet etching. An amorphous silicon film of thickness 34 nm is formed on the core material 112 as a sidewall material 116.

Then, as shown in FIG. 10, the sidewall material 116 is etched using RIE until a top surface portion of the core material 112 and a part of top surface of the mask material 110 are exposed. Thereafter, a silicon oxide film 118 of the same material as that of the core material 112 is deposited. Thus, the silicon oxide film 118 is also formed between parts of the sidewall material 116 between which the core material 112 is not sandwiched. In the present example, the distance between parts of the sidewall material 116 between which the core material 112 is sandwiched is longer than that between parts of the sidewall material 116 between which the core material 112 is not sandwiched. Furthermore, in FIG. 10 and FIG. 11, for simplification of description, the core material 112 is also illustrated as the silicon oxide film 118.

Then, as shown in FIG. 11, the silicon oxide film 118 is etched using RIE until the top surface of the sidewall material 116 is exposed. The amorphous silicon film, which corresponds to the sidewall material 116, is then removed using wet etching. Thus, the width of the silicon oxide film 118 formed between the parts of the sidewall material 116 between which the core material 112 is sandwiched is smaller than that formed between the parts of the sidewall material 116 between which the core material 112 is not sandwiched.

Then, as shown in FIG. 12, a mask material 110, a CG film 108, an inter-electrode insulating film 106, a charge accumulation layer 104, and a gate oxide film 102 are sequentially etched by RIE through the silicon oxide film 118 as a mask. Thus, a memory cell transistor MT structure is formed. At this time, the width, along the column direction, of the memory cell transistor structure formed under the area between the parts of the sidewall material 116 between which the core material 112 is sandwiched is smaller than that formed under the area between the parts of the sidewall material 116 between which the core material 112 is not sandwiched. In this manner, in the column direction, the memory cell transistors MT with the large CG width are formed alternately with the memory cell transistors MT with the small CG width.

The distance between the parts of the sidewall material 116 between which the core material 112 is sandwiched may be longer than that between the parts of the sidewall material 116 between which the core material 112 is not sandwiched, depending on the film thickness of the core material 112, the resist pattern 114, or the sidewall material 116, etching conditions, and the like.

(Modification 1)

Now, Modification 1 of the first embodiment will be described with reference to FIG. 13. In the description of the first embodiment, each NAND column 5 comprises six memory cell transistors MT, and the CG widths of the six memory cell transistors MT are different from one another. The memory cell transistors MT with the large CG width are preferentially programmed. In Modification 1 of the first embodiment, programming will be described which is performed when each NAND column 5 comprises more memory cell transistors MT.

Figure 13:
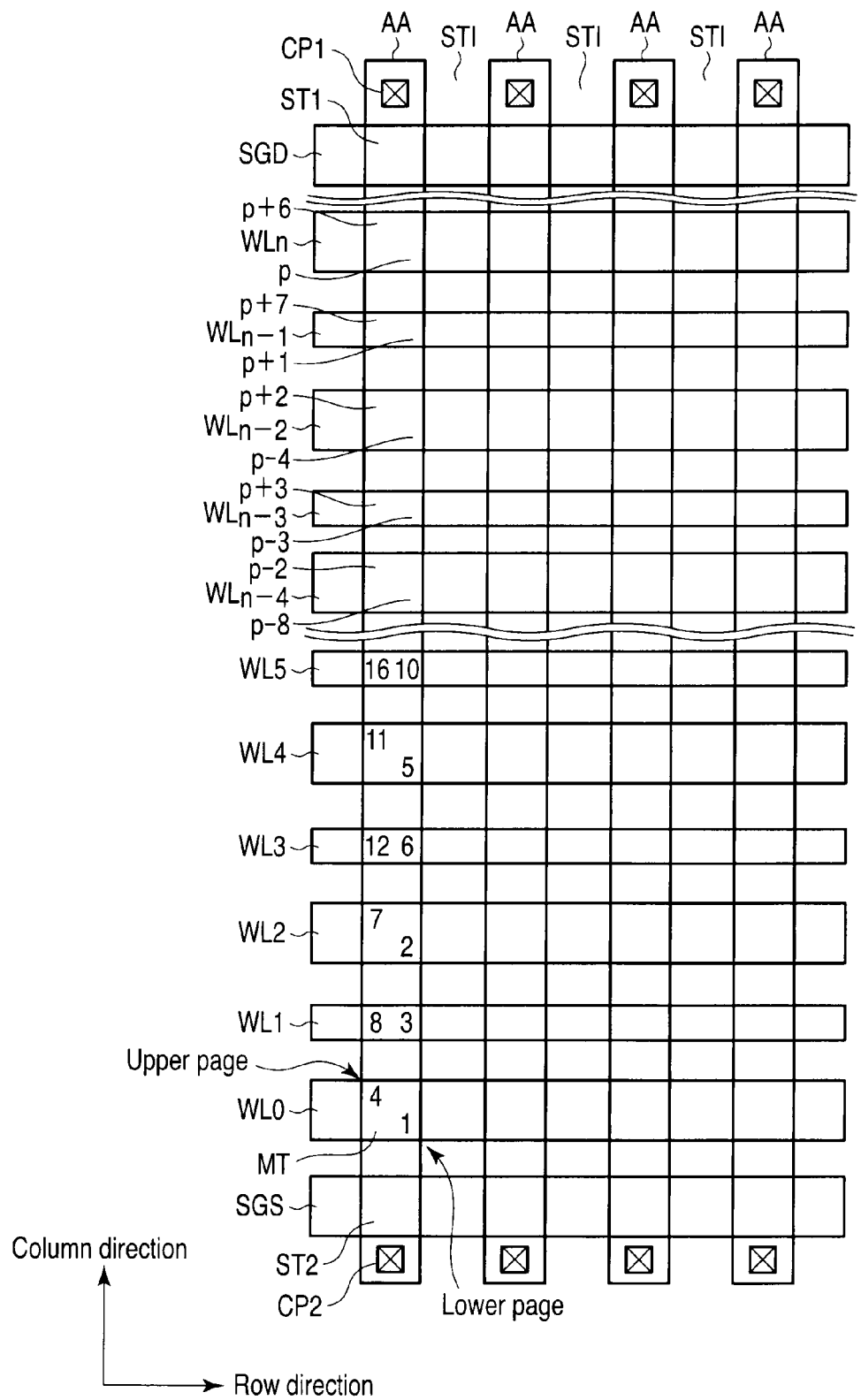
FIG. 13 is a plan view schematically showing a basic programming order for the NAND nonvolatile semiconductor memory device according to Modification 1 of the first embodiment.

FIG. 13 is a plan view schematically showing a basic programming order for a NAND nonvolatile semiconductor memory device according to Modification 1 of the first embodiment. The basic configuration of the NAND nonvolatile semiconductor memory device is similar to that in the above-described comparative example and first embodiment. Thus, matters described above in the comparative example and first embodiment as well as matters that can be easily analogized from the comparative example and first embodiment will not be described below.

As shown in FIG. 13, in the column direction, the memory cell transistor MT located at the intersection between AA and each of the word lines WL0, WL2, WL4, . . . has a larger CG width than that located at the intersection between AA and each of the word lines WL1 WL3, WL5, . . . . That is, the memory cell transistors MT with the large CG width are arranged alternately (periodically) with the memory cell transistors MT with the small CG width, from the select transistor ST2 side (source side) toward the select transistor ST1 side (drain side). Furthermore, in the row direction, the width of AA is prevented from varying. That is, in the row direction, the width of the memory cell transistor MT is prevented from varying.

Furthermore, as is the case with the first embodiment, before programming, a write pulse is applied to all the memory cell transistors. The threshold of each memory cell transistor is then read and stored in the storage circuit 7 as dimensional information on the memory cell transistor MT. Based on the dimensional information on the memory cell transistors MT, the programming order for the memory cell array 1 is determined.

In the NAND nonvolatile semiconductor memory device, programming is sequentially performed from the source-side memory cell transistor MT toward the drain-side memory cell transistor MT in the NAND column 5. The programming order is determined based on the dimensional information on the memory cell transistors MT stored in the storage circuit 7. In FIG. 13, the right number in the memory cell transistor MT indicates a turn programming a lower page. The left number in the memory cell transistor MT indicates a turn programming an upper page.

First, the data in the lower page is written to the memory cell transistor MT (belonging to the word line WL0) having the large CG width and located closest to the source line side (first write). Then, the data in the lower page is written to the memory cell transistor MT (belonging to the word line WL2) having the large CG width and to which the data in the lower page has not been written and which is located on the drain side of and adjacent to the memory cell transistor MT (belonging to the word line WL1) having the small CG width and to which the data in the lower page has not been written and which is located on the drain side of and adjacent to the memory cell transistor MT belonging to the word line WL0 and to which the data in the lower page has been written (second write). Thereafter, the data in the lower page is written to the memory cell transistor MT belonging to the word line WL1 and having the small CG width and to which the data in the lower page has not been written and which is located between the memory cell transistors MT belonging to the word lines WL0 and WL2, respectively (third write).

Then, the data in the upper page is written to the memory cell transistor MT belonging to the word line WL0 (fourth write). Then, the data in the lower page is written to the memory cell transistor MT (belonging to the word line WL4) having the large CG width and to which the lower page data has not been written and which is located on the drain side of and adjacent to the memory cell transistor MT (belonging to the word line WL3) having the small CG width and to which the lower page data has not been written and which is located on the drain side of and adjacent to the memory cell transistor MT belonging to the word line WL2 and to which the lower page data has been written (fifth write). Thereafter, the data in the lower page is written to the memory cell transistor MT belonging to the word line WL3 and having the small CG width and to which the lower page data has not been written and which is located between the memory cell transistors MT belonging to the word lines WL2 and WL4, respectively (sixth write).

Then, the data in the upper page is written to the memory cell transistor MT belonging to the word line WL2 and having the large CG width (seventh write). Thereafter, the data in the upper page is written to the memory cell transistor MT belonging to the word line WL1 and having the small CG width and to which the data in the upper page has not been written and which is located between the memory cell transistors MT belonging to the word lines WL0 and WL2, respectively (eighth write).

Then, the data in the lower page is written to the memory cell transistor MT (belonging to the word line WL6 (not shown in the drawings)) having the large CG width and to which the lower page data has not been written and which is located on the drain side of and adjacent to the memory cell transistor MT (belonging to the word line WL5) having the small CG width and to which the lower page data has not been written and which is located on the drain side of and adjacent to the memory cell transistor MT belonging to the word line WL4 and to which the lower page data has been written (ninth write). Thereafter, the data in the lower page is written to the memory cell transistor MT belonging to the word line WL5 and having the small CG width and to which the lower page data has not been written and which is located between the memory cell transistors MT belonging to the word lines WL4 and WL6, respectively (tenth write). Thereafter, programming is repeated in a similar order.

Then, the data in the lower page is written to the memory cell transistor MT (belonging to the word line WLn; n is an integer) having the large CG width and to which the data in the lower page data has not been written and which is located on the drain side of and adjacent to the memory cell transistor MT (belonging to the word line WLn−1) having the small CG width and to which the lower page data has not been written and which is located on the drain side of and adjacent to the memory cell transistors MT belonging to the word line WLn−2 to which the lower page data has been written (pth write). Thereafter, the data in the lower page is written to the memory cell transistor MT belonging to the word line WLn−1 and having the small CG width and to which the lower page data has not been written and which is located between the memory cell transistors MT belonging to the word lines WLn−2 and WLn, respectively (p+1th write). Then, the data in the upper data is written to the memory cell transistor MT belonging to the word line WLn−2 (p+2th write). Thereafter, the data in the upper page is written to the memory cell transistor MT belonging to the word line WLn−3 and having the small CG width and to which the data in the upper page has not been written and which is located between the memory cell transistors MT belonging to the word lines WLn−4 and WLn−2, respectively (p+3th write). In this manner, after the data in the lower page is written to the cells belonging to the word lines WLn and WLn−2 and having the large CG width, the data in the lower page is written to the cell having the small CG width and belonging to the word line WLn−1 located between the word lines WLn and WLn−2. Then, after the data in the upper page is written to the cell belonging to the word line WLn−2 and having the large CG width, the data in the upper page is written to the cell having the small CG width and belonging to the word line WLn−3 located between the word lines WLn−4 and WLn−2.

Subsequently, in a sequence similar to that described above, the memory cell transistors MT having the large CG width and located on the source and drain sides of and adjacent to the memory cell transistor MT with the small CG width are preferentially programmed.

Thus, in a predetermined memory cell transistor MT belonging to the word line WLn (n≧3), the difference in programming order between the lower page and the upper page is 6. Hence, after six programming operations have been performed since programming of the lower page of the predetermined memory cell transistor MT belonging to the word line WLn (n≧3), programming of the upper page of the predetermined memory cell transistor MT is carried out.

According to Modification 1 of the first embodiment described above, in the column direction, the memory cell transistors with the large CG width are arranged alternately with the memory cell transistors with the small CG width.

The programming order is such that the memory cell transistor MT with the large CG width is programmed earlier than the memory cell transistor MT with the small CG width. That is, after the adjacent memory cell transistor MT with the large CG width is programmed (programming of the lower page or the upper page), programming of the memory cell transistor MT with the small CG width (programming of the lower page or the upper page) is completed.

Thus, even if the NAND column includes a large number of memory cell transistors MT, the programming order can be easily and appropriately determined. During programming, the inter-cell interference effect can be suppressed.

(Modification 2)

Now, Modification 2 of the first embodiment will be described with reference to FIG. 14. In Modification 1 of the first embodiment described above, each memory cell transistor MT stores four values (2 bits). In Modification 2 of the first embodiment, programming will be described which is performed if eight values (3 bits) are recorded in each memory cell transistor MT.

FIG. 14 is a plan view schematically showing a basic programming order for a NAND nonvolatile semiconductor memory device according to Modification 2 of the first embodiment. The basic configuration of the NAND nonvolatile semiconductor memory device is similar to that in the above-described comparative example, first embodiment, and modification of the first embodiment. Thus, matters described above in the comparative example, first embodiment, and modification of the first embodiment as well as matters that can be easily analogized from the comparative example, first embodiment, and modification of the first embodiment will not be described below.

In FIG. 14, the right number in the memory cell transistor MT indicates a turn programming a lower page. The middle number in the memory cell transistor MT indicates a turn programming a middle page. The left number in the memory cell transistor MT indicates a turn programming an upper page. Here, the pth and subsequent programming operations will be described.

The data in the lower page is written to the memory cell transistor MT (belonging to the word line WLn (n is an integer)) with the large CG width (pth (p is an integer) write). Thereafter, the data in the lower page is written to the memory cell transistor MT belonging to the word line WLn−1 and having the small CG width and to which the data in the lower page has not been written and which is located between the memory cell transistors MT belonging to the word lines WLn−2 and WLn, respectively (p+1th write). Then, the data in the middle page is written to the memory cell transistor MT belonging to the word line WLn−2 (p+2th write). Thereafter, the data in the middle page is written to the memory cell transistor MT belonging to the word line WLn−3 and having the small CG width and to which the data in the middle page has not been written and which is located between the memory cell transistors MT belonging to the word lines WLn−4 and WLn−2, respectively (p+3th write). Then, the data in the upper page is written to the memory cell transistor MT belonging to the word line WLn−4 (p+4th write). Thereafter, the data in the upper page is written to the memory cell transistor MT belonging to the word line WLn−5 and having the small CG width and to which the data in the upper page has not been written and which is located between the memory cell transistors MT belonging to the word lines WLn−6 and WLn−4, respectively (p+5th write). Then, the data in the lower page is written to the memory cell transistor MT (belonging to the word line WLn+2 (not shown in the drawings)) having the large CG width and to which the data in the lower page has not been written and which is located on the drain side of and adjacent to the memory cell transistor MT (belonging to the word line WLn+1 (not shown in the drawings)) having the small CG width and to which the data in the lower page has not been written and which is located on the drain side of and adjacent to the memory cell transistor MT (belonging to the word line WLn) and to which the lower page has been written (p+6th write).

As described above, after the data in the lower page is written to the cells belonging to the word lines WLn and WLn−2 and having the large CG width, the data in the lower page is written to the cell having the small CG width and belonging to the word line WLn−1 located between the word lines WLn and WLn−2. Then, after the data in the middle page is written to the cell belonging to the word line WLn−2 and having the large CG width, the data in the middle page is written to the cell having the small CG width and belonging to the word line WLn−3 located between the word lines WLn−4 and WLn−2. Then, after the data in the upper page is written to the cell belonging to the word line WLn−4 and having the large CG width, the data in the upper page is written to the cell having the small CG width and belonging to the word line WLn−5 located between the word lines WLn−6 and WLn−4.

Subsequently, in a sequence similar to that described above, the memory cell transistors MT having the large CG width and located on the source and drain sides of and adjacent to the memory cell transistor MT with the small CG width are preferentially programmed.

Thus, in a predetermined memory cell transistor MT belonging to the word line WLn (n≧6), the difference in programming order between the lower page and the middle page and the difference in programming order between the middle page and the upper page are both 8. Hence, after eight programming operations have been performed since programming of the lower page of the predetermined memory cell transistor MT belonging to the word line WLn (n≧6) programming of the middle page of the predetermined memory cell transistor MT is carried out. Similarly, programming of the upper page of the predetermined memory cell transistor MT is carried out after eight programming operations have been performed since programming of the middle page of the predetermined memory cell transistor MT.

According to Modification 2 of the first embodiment described above, in the column direction, the memory cell transistors with the large CG width are arranged alternately with the memory cell transistors with the small CG width.

The programming order is such that the memory cell transistor MT with the large CG width is programmed earlier than the memory cell transistor MT with the small CG width. That is, after the adjacent memory cell transistor MT with the large CG width is programmed (programming of the lower page, the middle page, or the upper page), programming of the memory cell transistor MT with the small CG width (programming of the lower page or the upper page) is completed.

Thus, even if the NAND column 5 includes a large number of memory cell transistors MT, the programming order can be easily and appropriately determined. During programming, the inter-cell interference effect can be suppressed.

(Modification 3)

Now, Modification 3 of the first embodiment will be described with reference to FIG. 15. In Modification 2 of the first embodiment described above, each memory cell transistor MT stores eight values (3 bits). In Modification 3 of the first embodiment, programming will be described which is performed if 16 values (4 bits) are recorded in each memory cell transistor MT.

Figure 15:
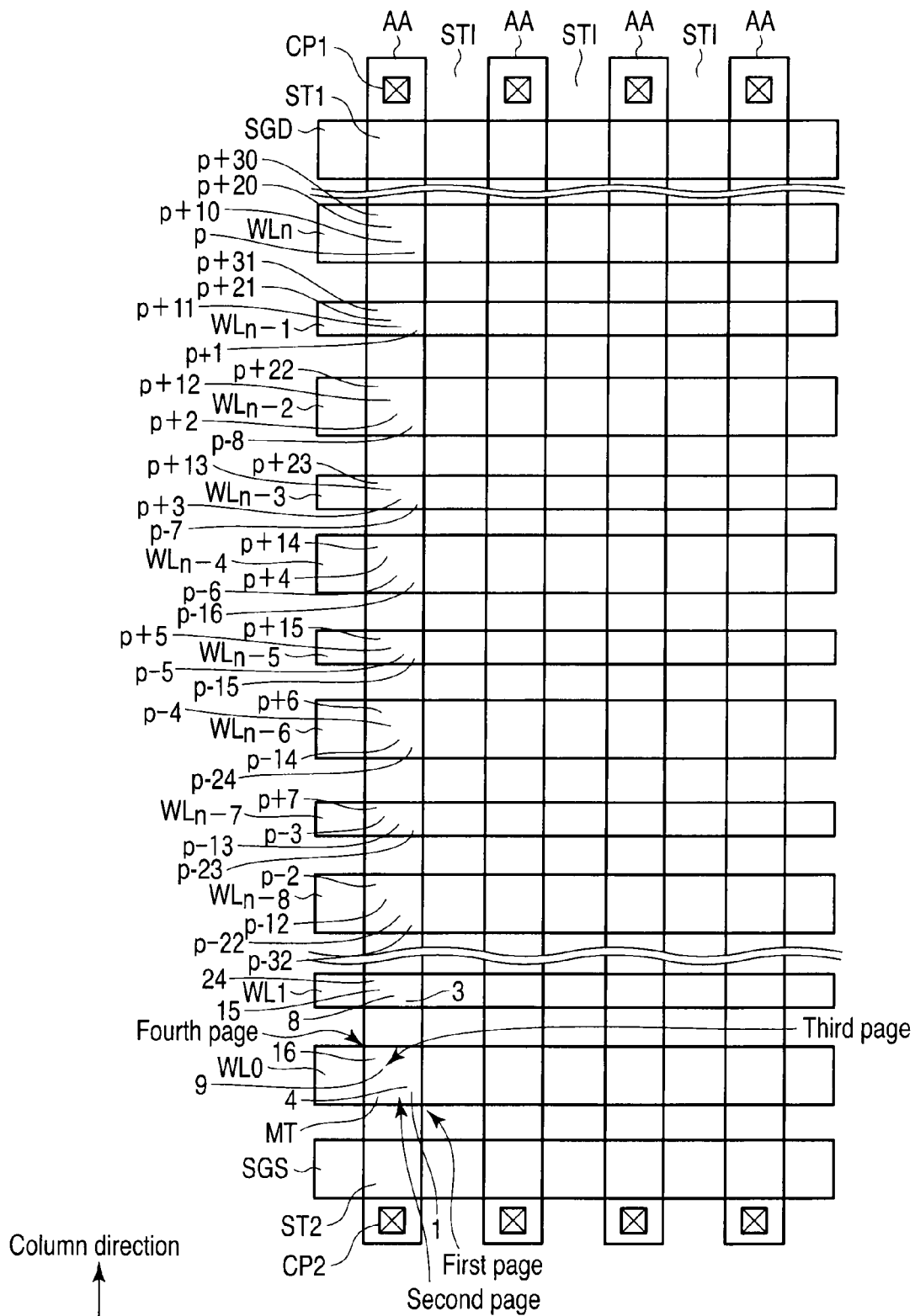
FIG. 15 is a plan view schematically showing a basic programming order for the NAND nonvolatile semiconductor memory device according to Modification 3 of the first embodiment.

FIG. 15 is a plan view schematically showing a basic programming order for a NAND nonvolatile semiconductor memory device according to Modification 3 of the first embodiment. The basic configuration of the NAND nonvolatile semiconductor memory device is similar to that in the above-described comparative example, first embodiment, and modification of the first embodiment. Thus, matters described above in the comparative example, first embodiment, and modification of the first embodiment as well as matters that can be easily analogized from the comparative example, first embodiment, and modification of the first embodiment will not be described below.

In FIG. 15, the rightmost number in the memory cell transistor MT indicates a turn programming a first page. The second number in the memory cell transistor MT from the right end indicates a turn programming a second page. The third number in the memory cell transistor MT from the right end indicates a turn programming a third page. The fourth number in the memory cell transistor MT from the right end indicates a turn programming a fourth page. Here, the pth and subsequent programming operations will be described.

The data in the first page is written to the memory cell transistor MT (belonging to the word line WLn (n is an integer)) with the large CG width (pth (p is an integer) write). Thereafter, the data in the first page is written to the memory cell transistor MT belonging to the word line WLn−1 and having the small CG width and to which the data in the first page has not been written and which is located between the memory cell transistors MT belonging to the word lines WLn−2 and WLn, respectively (p+1th write). Then, the data in the second page is written to the memory cell transistor MT belonging to the word line WLn−2 (p+2th write). Thereafter, the data in the second page is written to the memory cell transistor MT belonging to the word line WLn−3 and having the small CG width and to which the data in the second page has not been written and which is located between the memory cell transistors MT belonging to the word lines WLn−4 and WLn−2, respectively (p+3th write). Then, the data in the third page is written to the memory cell transistor MT belonging to the word line WLn−4 (p+4th write). Thereafter, the data in the third page is written to the memory cell transistor MT belonging to the word line WLn−5 and having the small CG width and to which the data in the third page has not been written and which is located between the memory cell transistors MT belonging to the word lines WLn−6 and WLn−4, respectively (p+5th write). Then, the data in the fourth page is written to the memory cell transistor MT belonging to the word line WLn−6 (p+6th write). Thereafter, the data in the fourth page is written to the memory cell transistor MT belonging to the word line WLn−7 and having the small CG width and to which the data in the fourth page has not been written and which is located between the memory cell transistors MT belonging to the word lines WLn−8 and WLn−6, respectively (p+7th write). Then, the data in the first page is written to the memory cell transistor MT (belonging to the word line WLn+2 (not shown in the drawings)) having the large CG width and to which the data in the first page has not been written and which is located on the drain side of and adjacent to the memory cell transistor MT (belonging to the word line WLn+1 (not shown in the drawings)) having the small CG width and to which the data in the first page has not been written and which is located on the drain side of and adjacent to the memory cell transistor MT (belonging to the word line WLn) and to which the first page has been written (p+8th write).

In this manner, for example, after the data in the first page is written to the cells belonging to the word lines WLn and WLn−2 and having the large CG width, the data in the first page is written to the cell having the small CG width and belonging to the word line WLn−1 located between the word lines WLn and WLn−2. Then, after the data in the second page is written to the cell belonging to the word line WLn−2 and having the large CG width, the data in the second page is written to the cell having the small CG width and belonging to the word line WLn−3 located between the word lines WLn−4 and WLn−2. Then, after the data in the third page is written to the cell belonging to the word line WLn−4 and having the large CG width, the data in the third page is written to the cell having the small CG width and belonging to the word line WLn−5 located between the word lines WLn−6 and WLn−4. Then, after the data in the fourth page is written to the cell belonging to the word line WLn−6 and having the large CG width, the data in the fourth page is written to the cell having the small CG width and belonging to the word line WLn−7 located between the word lines WLn−8 and WLn−6.

Subsequently, in a sequence similar to that described above, the memory cell transistors MT having the large CG width and located on the source and drain sides of and adjacent to the memory cell transistor MT with the small CG width are preferentially programmed.

Thus, in a predetermined memory cell transistor MT belonging to the word line WLn (n≧8), the difference in programming order between the first page and the second page, the difference in programming order between the second page and the third page, and the difference in programming order between the third page and the fourth page are each 10. Hence, after 10 programming operations have been performed since programming of the first page of the predetermined memory cell transistor MT belonging to the word line WLn (n≧8), programming of the second page of the predetermined memory cell transistor MT is carried out. Furthermore, programming of the fourth page of the predetermined memory cell transistor MT is carried out after 10 programming operations have been performed since programming of the third page of the predetermined memory cell transistor MT.

According to Modification 3 of the first embodiment described above, in the column direction, the memory cell transistors with the large CG width are arranged alternately with the memory cell transistors with the small CG width.

The programming order is such that the memory cell transistor MT with the large CG width is programmed earlier than the memory cell transistor MT with the small CG width. That is, after the adjacent memory cell transistor MT with the large CG width is programmed (programming of the first page, the second page, the third page, or the fourth page), programming of the memory cell transistor MT with the small CG width (programming of the first page, the second page, the third page, or the fourth page) is completed.

Thus, even if the NAND column 5 includes a large number of memory cell transistors MT, the programming order can be easily and appropriately determined. During programming, the inter-cell interference effect can be suppressed.

(Modification 4)

Now, Modification 4 of the first embodiment will be described with reference to FIG. 16. In Modification 4 of the first embodiment, the memory cell transistors MT described above in the first embodiment are differently arranged.

Figure 16:
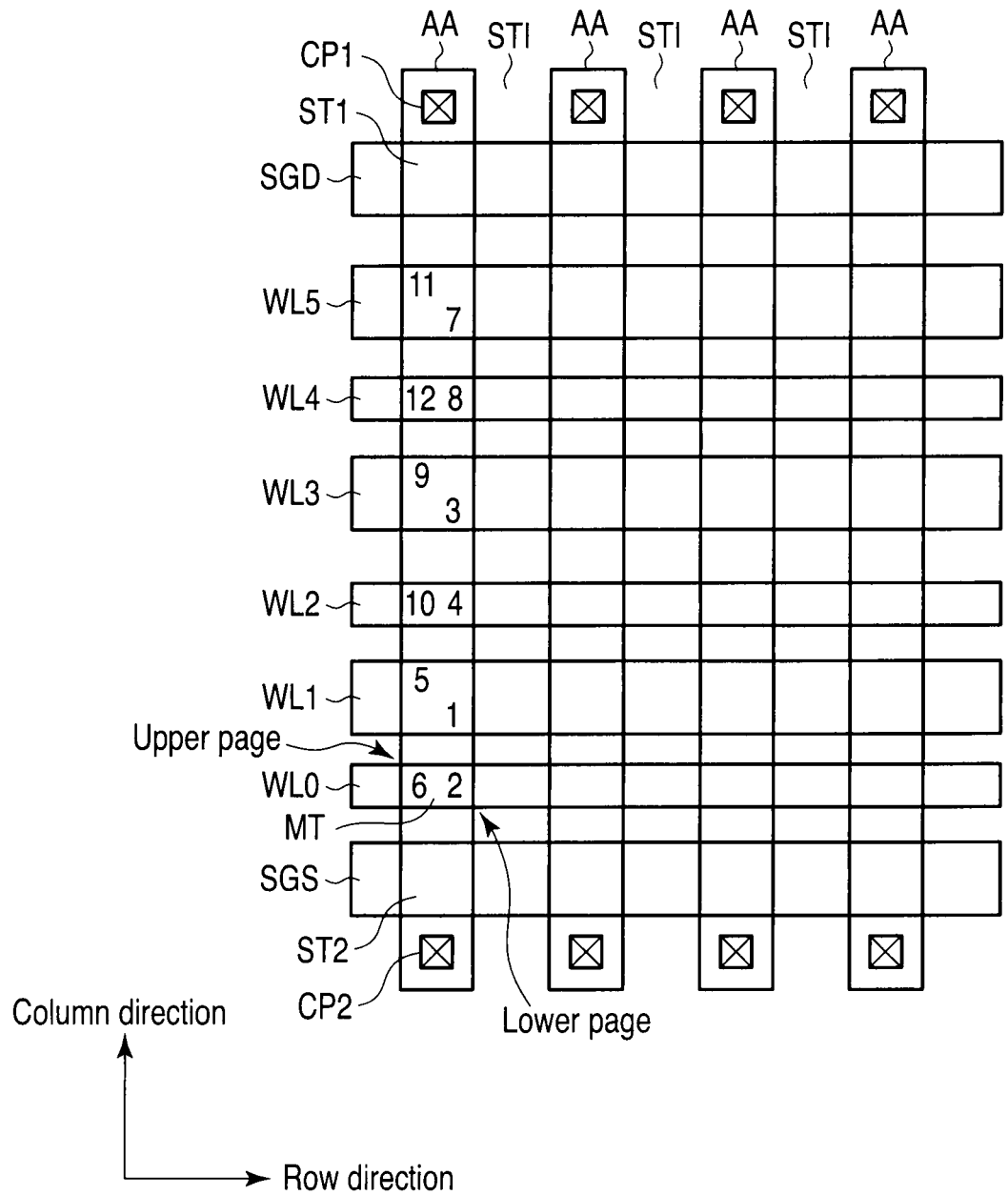
FIG. 16 is a plan view schematically showing a basic programming order for the NAND nonvolatile semiconductor memory device according to Modification 4 of the first embodiment.

FIG. 16 is a plan view schematically showing a basic programming order for a NAND nonvolatile semiconductor memory device according to Modification 4 of the first embodiment. The basic configuration of the NAND nonvolatile semiconductor memory device is similar to that in the above-described comparative example and first embodiment. Thus, matters described above in the comparative example and first embodiment as well as matters that can be easily analogized from the comparative example and first embodiment will not be described below.

As shown in FIG. 16, in the column direction, the memory cell transistor MT located at the intersection between AA and each of the word lines WL0, WL2, and WL4 has a smaller CG width than that located at the intersection between AA and each of the word lines WL1, WL3, and WL5. That is, the memory cell transistors MT with the small CG width are arranged alternately (periodically) with the memory cell transistors MT with the large CG width, from the select transistor ST2 side (source side) toward the select transistor ST1 side (drain side). Furthermore, in the row direction, the width of AA is prevented from varying. That is, in the row direction, the width of the memory cell transistor MT is prevented from varying. For simplification, each NAND column 5 is assumed to comprise six memory cell transistors MT.

Furthermore, as is the case with the first embodiment, before programming, a write pulse is applied to all the memory cell transistors. The threshold of each memory cell transistor is then read and stored in the storage circuit 7 as dimensional information on the memory cell transistor MT. Based on the dimensional information on the memory cell transistors MT, the programming order for the memory cell array 1 is determined.

In the NAND nonvolatile semiconductor memory device, programming is sequentially performed from the source-side memory cell transistor MT toward the drain-side memory cell transistor MT in the NAND column 5. The programming order is determined based on the dimensional information on the memory cell transistors MT stored in the storage circuit 7. In FIG. 16, the right number in the memory cell transistor MT indicates a turn programming a lower page. The left number in the memory cell transistor MT indicates a turn programming an upper page.

First, the data in the lower page is written to the memory cell transistor MT (belonging to the word line WL1) having the large CG width and located closest to the source line side (first write). Then, the data in the lower page is written to the memory cell transistor MT (belonging to the word line WL0) having the small CG width and to which the data in the lower page has not been written and which is located on the source side of and adjacent to the memory cell transistor MT belonging to the word line WL1 and to which the data in the lower page has been written (second write).

Then, the data in the lower page is written to the memory cell transistor MT (belonging to the word line WL3) having the large CG width and to which the data in the lower page has not been written and which is located on the drain side of and adjacent to the memory cell transistor MT (belonging to the word line WL2) having the small CG width and to which the data in the lower page has not been written and which is located on the drain side of and adjacent to the memory cell transistor MT belonging to the word line WL1 and to which the data in the lower page has been written (third write). Subsequently, the data in the lower page is written to the memory cell transistor MT belonging to the word line WL2 and having the small CG width and to which the lower page data has not been written and which is located between the memory cell transistors MT belonging to the word lines WL1 and WL3, respectively (fourth write). Then, the data in the upper page is written to the memory cell transistor MT belonging to the word line WL1 (fifth write). Thereafter, the data in the upper page is written to the memory cell transistor MT (belonging to the word line WL0) having the small CG width and to which the data in the upper page has not been written and which is located on the source side of and adjacent to the word line memory WL1 (sixth write).

Then, the data in the lower page is written to the memory cell transistor MT (belonging to the word line WL5) having the large CG width and to which the data in the lower page has not been written and which is located on the drain side of and adjacent to the memory cell transistor MT (belonging to the word line WL4) having the small CG width and to which the lower page data has not been written and which is located on the drain side of and adjacent to the memory cell transistor MT belonging to the word line WL3 and to which the data in the lower page has been written (seventh write). Subsequently, the data in the lower page is written to the memory cell transistor MT belonging to the word line WL4 and having the small CG width and to which the data in the lower page has not been written and which is located between the memory cell transistors MT belonging to the word lines WL3 and WL5, respectively (eighth write). Then, the data in the upper page is written to the memory cell transistor MT belonging to the word line WL3 (ninth write). Then, the data is the upper data is written to the memory cell transistor MT (belonging to the word line WL2) having the small CG width and to which the upper page data has not been written and which is located between the memory cell transistor MT belonging to the word lines WL3 and WL1, respectively, and to which the lower page data and the upper page data have been written (tenth write).

Then, the data in the upper page is written to the memory cell transistor MT (belonging to the word line WL5) having the large CG width and to which the data in the upper page has not been written and which is located on the drain side of and adjacent to the memory cell transistor MT (belonging to the word line WL4) having the small CG width and to which the data in the upper page has not been written and which is located on the drain side of and adjacent to the memory cell transistor MT belonging to the word line WL3 and to which the data in the upper page has been written (eleventh write). Then, the data in the upper data is written to the memory cell transistor MT (belonging to the word line WL4) having the small CG width and to which the upper page data has not been written and which is located between the memory cell transistor MT belonging to the word lines WL5 and WL3, respectively, and to which the lower page data and the upper page data have been written (twelfth write).

As described above, the memory cell transistors MT having the large CG width and located on the source and drain sides of and adjacent to the memory cell transistor MT with the small CG width are preferentially programmed.

According to Modification 4 of the first embodiment described above, in the column direction, the memory cell transistors with the small CG width are arranged alternately with the memory cell transistors with the large CG width from the source line side toward the drain line side.

The programming order is such that the memory cell transistor MT with the large CG width is programmed earlier than the memory cell transistor MT with the small CG width. That is, after the adjacent memory cell transistor MT with the large CG width is programmed (programming of the lower page or the upper page), programming of the memory cell transistor MT with the small CG width (programming of the lower page or the upper page) is completed.

Thus, as is the case with the above-described first embodiment, the inter-cell interference effect can be suppressed.

In Modification 4, only six memory cell transistors MT are included in the NAND column 5. However, as described above in Modification 1 of the first embodiment, a similar programming method may be used even if the NAND column 5 includes more than six memory cell transistors.
(Modification 5)

Now, Modification 5 of the first embodiment will be described with reference to FIG. 17. In the description of Modification 5 of the first embodiment, the memory cell transistors with the small CG width are arranged such that two memory cell transistors are sandwiched between two memory cell transistors with the large CG width.

Figure 17:
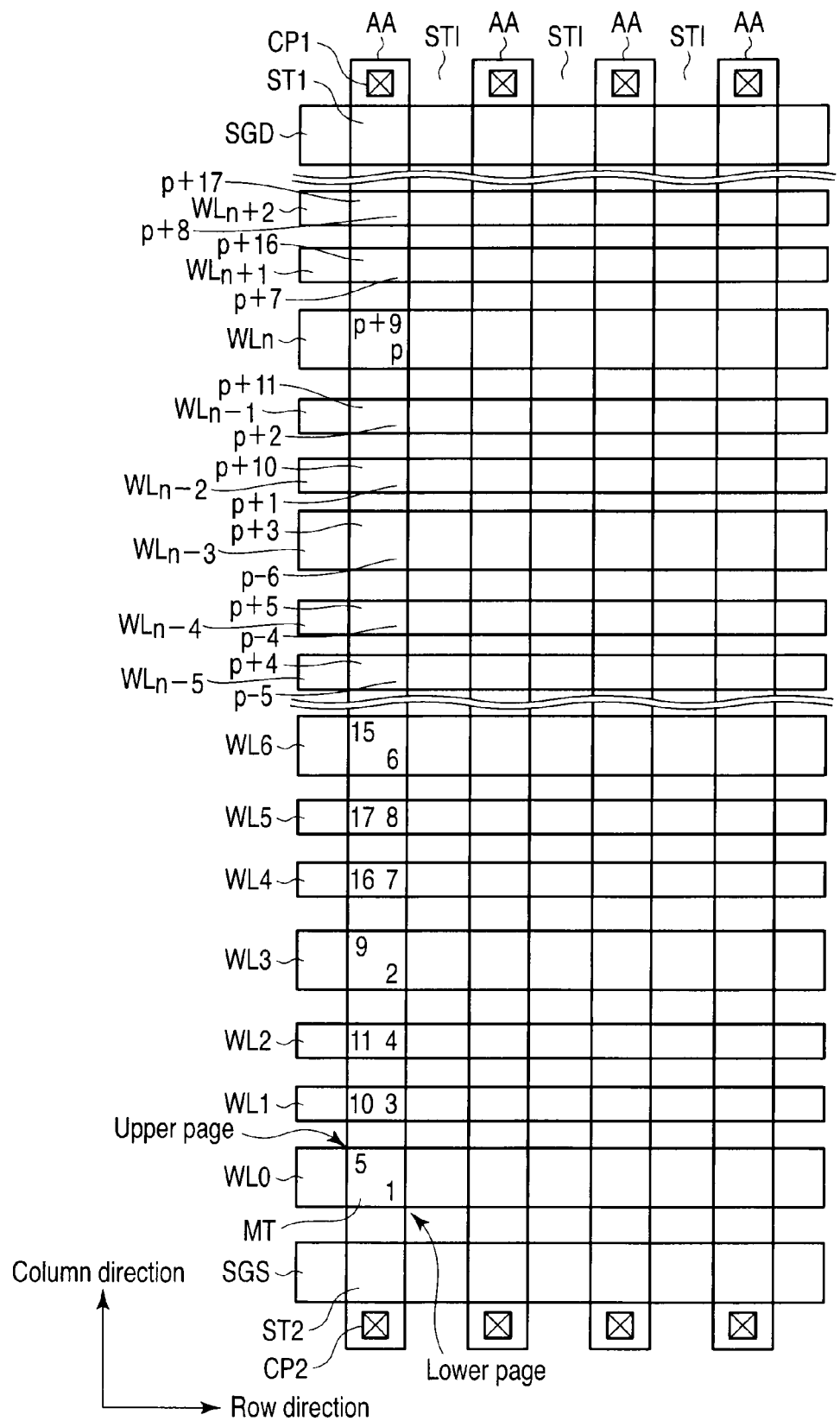
FIG. 17 is a plan view schematically showing a basic programming order for the NAND nonvolatile semiconductor memory device according to Modification 5 of the first embodiment.

FIG. 17 is a plan view schematically showing a basic programming order for a NAND nonvolatile semiconductor memory device according to Modification 5 of the first embodiment. The basic configuration of the NAND nonvolatile semiconductor memory device is similar to that in the above-described comparative example and first embodiment. Thus, matters described above in the comparative example and first embodiment as well as matters that can be easily analogized from the comparative example and first embodiment will not be described below.

As shown in FIG. 17, in the column direction, the memory cell transistor MT located at the intersection between AA and each of the word lines WL0, WL3, WL6, WL3m–3 (m is an integer) has a larger CG width than that located at the intersection between AA and each of the word lines WL1, WL2, WL4, WL5, WL3m–2, WL3m–1. That is, the memory cell transistors MT with the large CG width are (periodically) arranged from the select transistor ST2 side (source side) toward the select transistor ST1 side (drain side) such that two memory cell transistors MT with the small CG width are sandwiched between two memory cell transistors MT with the large CG width. Furthermore, in the row direction, the width of AA is prevented from varying. That is, in the row direction, the width of the memory cell transistor MT is prevented from varying.

Furthermore, as is the case with the first embodiment, before programming, a write pulse is applied to all the memory cell transistors. The threshold of each memory cell transistor is then read and stored in the storage circuit 7 as dimensional information on the memory cell transistor MT. Based on the dimensional information on the memory cell transistors MT, the programming order for the memory cell array 1 is determined.

In the NAND nonvolatile semiconductor memory device, programming is sequentially performed from the source-side memory cell transistor MT toward the drain-side memory cell transistor MT in the NAND column 5. The programming order is determined based on the dimensional information on the memory cell transistors MT stored in the storage circuit 7. In FIG. 17, the right number in the memory cell transistor MT indicates a turn programming a lower page. The left number in the memory cell transistor MT indicates a turn programming an upper page.

First, the data in the lower page is written to the memory cell transistor MT (belonging to the word line WL0) having the large CG width and located closest to the source line side (first write). Then, the data in the lower page is written to the memory cell transistor MT (belonging to the word line WL3) having the large CG width and located on the drain side of the memory cell transistor MT belonging to the word line WL0 and to which the data in the lower page has been written (second write). Then, the data in the lower page is written to the memory cell transistors MT belonging to the word lines WL1 and WL2 and having the small CG width and to which the data in the lower page has not been written and which are sandwiched between the memory cell transistors MT belonging to the word lines WL0 and WL3 and having the large CG width and to which the data in the lower page has been written (third and fourth writes).

Then, the data in the lower page is written to the memory cell transistors MT (belonging to the word lines WL1 and WL2) with the small CG width, and the data in the upper page is then written to the memory cell transistor MT belonging to the word line WL0 and having the large CG width (fifth write). Subsequently, the data in the lower page is written to the memory cell transistor MT (belonging to the word line WL6) having the large CG width and which is located on the drain side of the memory cell transistor MT belonging to the word line WL3 and to which the data in the lower page has been written (sixth write). Then, the data in the lower page is written to the memory cell transistors MT having the small CG width and belonging to the word lines WL4 and WL5 sandwiched between the memory cell transistors MT belonging to the word lines WL3 and WL6 and having the large CG width and to which the data in the lower page has been written (seventh and eighth writes). Then, the data in the lower page is written to the memory cell transistors MT (belonging to the word lines WL4 and WL5) with the small CG width, and the data in the upper page is then written to the memory cell transistor MT belonging to the word line WL3 (ninth write). Then, the data in the upper page is written to the memory cell transistors MT having the small CG width and belonging to the word lines WL1 and WL2 sandwiched by the memory cell transistors MT belonging to the word lines WL0 and WL3 and having the large CG width and to which the data in the lower page has been written (tenth and eleventh writes). Thereafter, programming is repeated in accordance with a similar sequence.

Then, the data in the lower page is written to the memory cell transistor MT (belonging to the word line WLn) having the large CG width and located on the drain side of the memory cell transistor MT belonging to the word line WLn–3 (n is an integer) and to which the data in the lower page has been written (pth write). Then, the data in the lower page is written to the memory cell transistors MT having the small CG width and belonging to the word lines WLn–2 and WLn–1 sandwiched by the memory cell transistors MT belonging to the word lines WLn–3 and WLn and having the large CG width and to which the data in the lower page has been written (p+1th and p+2th writes). The data in the lower page is written to the memory cell transistors MT (belonging to the word lines WLn–2 and WLn–1) with the small CG width, and the data in the upper page is then written to the memory cell transistors MT belonging to the word line WLn–3 (p+3th write). Then, the data in the upper page is written to the memory cell transistors MT having the small CG width and belonging to the word lines WLn–5 and WLn–4 sandwiched by the memory cell transistors MT belonging to the word lines WLn–6 and WLn–3 and having the large CG width and to which the data in the lower page has been written (p+4th and p+5th writes).

Thereafter, in a similar sequence, the memory cell transistors MT having the large CG width and located on the source and drain sides of and adjacent to the memory cell transistor MT with the small CG width are preferentially programmed. For example, the data in the lower page is written to the cells belonging to the word lines WLn and WLn+3 and having the large CG width, and the data in the lower page is then written to the cells having the small CG width and belonging to the word lines WLn+1 and WLn+2 sandwiched between the word lines WLn and WLn+3. Thereafter, the data in the upper page is written to the cells belonging to the word line WLn and having the large CG width, and the data in the upper page is then written to the cells having the small CG width and belonging to the word lines WLn−2 and WLn−1 sandwiched between the word lines WLn−3 and WLn.

According to Modification 5 of the first embodiment described above, in the column direction, the memory cell transistors with the large CG width are arranged such that two memory cell transistors with the small CG width are sandwiched between two memory cell transistors with the large CG width.

The programming order is such that the memory cell transistor MT with the large CG width is programmed earlier than the memory cell transistor MT with the small CG width. That is, after the memory cell transistors MT having the large CG width and between which two memory cell transistors MT with the small CG width are sandwiched in the column direction are programmed (programming of the lower page or the upper page), programming of the memory cell transistors MT with the small CG width (programming of the lower page or the upper page) is completed.

Thus, even if the memory cell transistors MT with the large CG width and the memory cell transistors MT with the small CG width are not alternately formed, the programming order can be easily and appropriately determined. During programming, the inter-cell interference effect can be suppressed.

In the first embodiment, Modification 1 of the first embodiment, Modification 2 of the first embodiment, Modification 3 of the first embodiment, Modification 4 of the first embodiment, and Modification 5 of the first embodiment, only the programming method for the single NAND column 5 along the column direction is illustrated. Alternatively, the following programming is possible. The above-described programming method is used for the column direction, whereas the conventional LM scheme is used for the row direction.

(Second Embodiment)

Now, a second embodiment will be described with reference to FIG. 18. In the above-described first embodiment, the CG width of the memory cell transistor MT along the column direction varies among a plurality of memory cell transistors MT, and the memory cell transistors MT with the large CG width are preferentially programmed. In the second embodiment, the widths of AA and a charge accumulation layer (hereinafter referred to as the AA width) along the row direction vary among a plurality of memory cell transistors MT. Memory cell transistors with a large AA width (a large AA size) are programmed preferentially over memory cell transistors MT with a small AA width (a small AA size). The AA width (AA size) corresponds to the gate width of the memory cell transistor MT.

Figure 18:
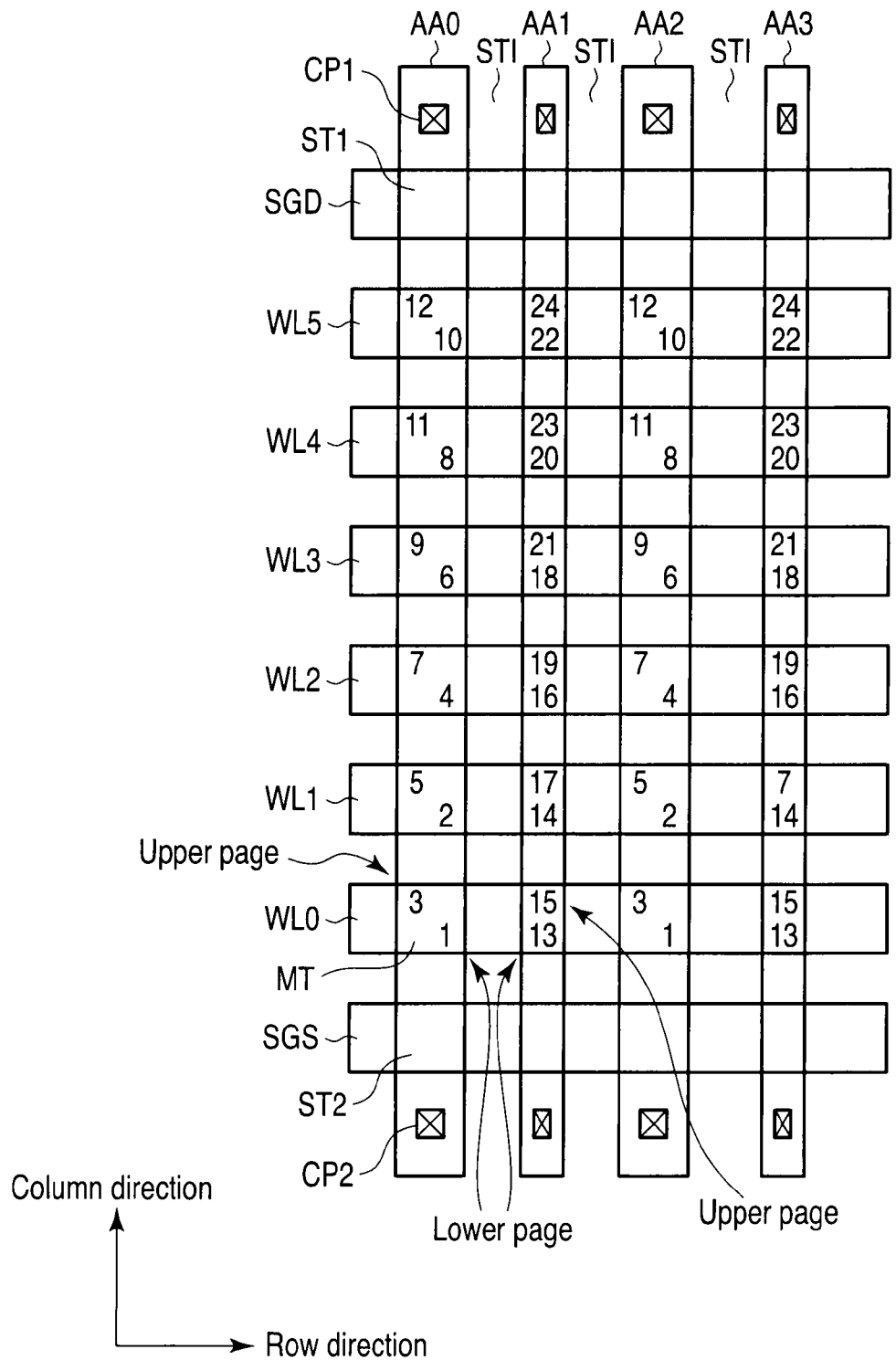
FIG. 18 is a plan view schematically showing a basic programming order for a NAND nonvolatile semiconductor memory device according to a second embodiment.

FIG. 18 is a plan view schematically showing a basic programming order for a NAND nonvolatile semiconductor memory device according to the second embodiment. The basic configuration of the NAND nonvolatile semiconductor memory device is similar to that in the above-described comparative example. Thus, matters described above in the comparative example as well as matters that can be easily analogized from the comparative example will not be described below.

As shown in FIG. 18, in the column direction, the memory cell transistor MT located at the intersection between a word line WL and each of AA0 and AA2 has a larger AA width than that located at the intersection between the word line WL and each of AA1 and AA3. That is, in the row direction, the memory cell transistors MT with a large AA width are arranged alternately (periodically) with the memory cell transistors MT with a small AA width. Furthermore, in the column direction, the width of the word line (CG width) is prevented from varying. For simplification, each NAND column 5 is assumed to comprise six memory cell transistors MT, and only four NAND columns 5 are shown.

Before programming, a write pulse is applied to all the memory cell transistors. The threshold of each memory cell transistor is then read and stored in a storage circuit 7 as dimensional information on the memory cell transistor MT. Based on the dimensional information on the memory cell transistors MT, the programming order for a memory cell array 1 is determined.

In the NAND nonvolatile semiconductor memory device, programming is sequentially performed from the source-side memory cell transistor MT toward the drain-side memory cell transistor MT. The programming order is determined based on the dimensional information on the memory cell transistors MT stored in the storage circuit 7. In FIG. 18, the right or lower number in the memory cell transistor MT indicates a turn programming a lower page. The left or upper number in the memory cell transistor MT indicates a turn programming an upper page.

First, the conventional LM scheme is used to start performing programming, in the row direction, on the NAND columns 5 (belonging to AA0 and AA2) in which the memory cell transistors have the large AA width. After the memory cell transistors MT belonging to the word line WL5 are completely programmed, programming of the NAND columns 5 (belonging to AA1 and AA3) in which the memory cell transistors MT have a small AA width is completed using the conventional LM scheme.

According to the above-described second embodiment, in the row direction, the memory cell transistors MT with the large AA width are arranged alternately with the memory cell transistors MT with the small AA width.

The programming order is such that the memory cell transistor MT with the large AA width is programmed earlier than the memory cell transistor MT with the small AA width. That is, after the memory cell transistor MT with the large AA width is programmed (programming of the lower page and the upper page), programming of the memory cell transistor MT with the small AA width (programming of the lower page and the upper page) is completed. Specifically, write is carried out earlier on the NAND columns 5 in which the memory cell transistors MT have the large gate width, in the word line direction, to complete programming the NAND column 5. Then, the NAND columns 5 in which the memory cell transistors MT have the small gate width are programmed in the word line direction.

Thus, the inter-cell interference effect exerted on the memory cell transistors MT with the small AA width can be suppressed. Furthermore, the present embodiment enables a reduction in the inter-cell interference effect exerted on the memory cell transistors MT with the large AA width by the memory cell transistors MT with the small AA width. Thus, compared to the case where programming is performed regardless of the cell size, the present embodiment can suppress the inter-cell interference effect during programming.

The programming order in the column direction is similar to that in the conventional LM scheme.

(Modification)

Now, a modification of the second embodiment will be described with reference to FIG. 19.

Figure 19:
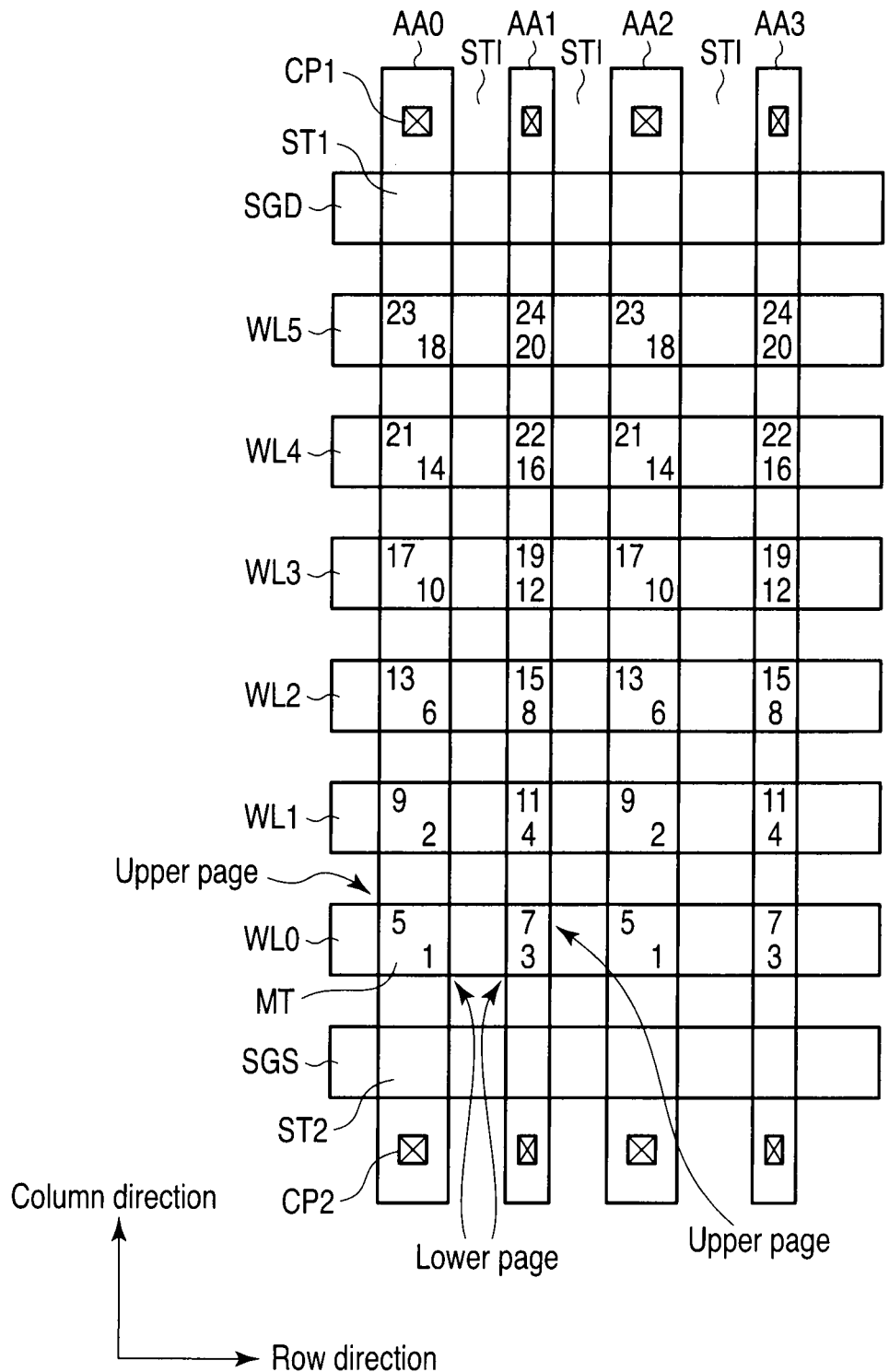
FIG. 19 is a plan view schematically showing a basic programming order for a NAND nonvolatile semiconductor memory device according to a modification of the second embodiment.

FIG. 19 is a plan view schematically showing a basic programming order for a NAND nonvolatile semiconductor memory device according to a modification of the second embodiment. The basic configuration of the NAND nonvolatile semiconductor memory device is similar to that in the above-described comparative example and second embodiment. Thus, matters described above in the comparative example and second embodiment as well as matters that can be easily analogized from the comparative example and second embodiment will not be described below.

As shown in FIG. 19, in the row direction, the memory cell transistor MT located at the intersection between the word line WL and each of AA0 and AA2 has a larger AA width than that located at the intersection between the word line WL and each of AA1 and AA3. That is, in the row direction, the memory cell transistors MT with the large AA width are arranged alternately (periodically) with the memory cell transistors MT with the small AA width. Furthermore, in the column direction, the width of the word line (the width of CG) is prevented from varying. For simplification, the NAND column 5 is assumed to comprise six memory cell transistors MT, and only four NAND columns 5 are shown.

Before programming, a write pulse is applied to all the memory cell transistors. The threshold of each memory cell transistor is then read and stored in the storage circuit 7 as dimensional information on the memory cell transistor MT. Based on the dimensional information on the memory cell transistors MT, the programming order for the memory cell array 1 is determined.

In the NAND nonvolatile semiconductor memory device, programming is sequentially performed from the source-side memory cell transistor MT toward the drain-side memory cell transistor MT in the NAND column 5. The programming order is determined based on the dimensional information on the memory cell transistors MT stored in the storage circuit 7. In FIG. 19, the right or lower number in the memory cell transistor MT indicates a turn programming a lower page. The left or upper number in the memory cell transistor MT indicates a turn programming an upper page.

First, in the row direction, in the NAND columns 5 (belonging to AA0 and AA2) in which the memory cell transistors MT have the large AA width, the data in the lower page is written to the memory cell transistor MT (belonging to the word line WL0) located closest to the source line side (first write). Then, the data in the lower page is written to the memory cell transistor MT (belonging to the word line WL1) located on the drain side of the memory cell transistor MT belonging to the word line WL0 and to which the data in the lower page has been written (second write). With the data in the lower page written to the memory cell transistors MT belonging to the word lines WL0 and WL1, respectively, and having the large AA width, in the NAND columns (belonging to AA1 and AA3) in which the memory cell transistors MT have the small AA width, the data in the lower page is written to the memory cell transistor MT (belonging to the word line WL0) located closest to the source line side (third write). Then, the data in the lower page is written to the memory cell transistor MT (belonging to the word line WL1) located on the drain side of the memory cell transistor MT belonging to the word line WL0 and to which the data in the lower page has been written (fourth write).

Then, with the data in the lower page written to the memory cell transistors MT belonging to the word lines WL0 and WL1, respectively, in the NAND columns (belonging to AA0 and AA2) in which the memory cell transistors MT have the large AA width, the data in the upper page is written to the memory cell transistor MT (belonging to the word line WL0) which is included in the memory cell transistors MT with the data in the upper page not written thereto and which is located close to the source line (fifth write). Then, the data in the lower page is written to the memory cell transistor MT (belonging to the word line WL2) located on the drain side of and adjacent to the memory cell transistor MT belonging to the word line WL1 and to which the data in the lower page has been written (sixth write). With the data in the upper page written to the memory cell transistor MT belonging to the word line WL0 and having the large AA width and with the data in the lower page written to the memory cell transistor MT belonging to the word line WL2 and having the large AA width, in the NAND columns 5 (belonging to AA1 and AA3) in which the memory cell transistors MT have the small AA width, the data in the upper page is written to the memory cell transistor (belonging to the word line WL0) which is included in the memory cell transistors MT with the data in the upper page not written thereto and which is located close to the source line (seventh write). Then, the data in the lower page is written to the memory cell transistor MT (belonging to the word line WL2) located on the drain side of and adjacent to the memory cell transistor MT belonging to the word line WL1 and to which the data in the lower page has been written (eighth write).

Then, with the data in the upper page written to the memory cell transistor MT belonging to the word line WL0 and with the data in the lower page written to the memory cell transistor MT belonging to the word line WL2, in the NAND columns (belonging to AA0 and AA2) in which the memory cell transistors MT have the large AA width, the data in the upper page is written to the memory cell transistor MT (belonging to the word line WL1) which is included in the memory cell transistors MT with the data in the upper page not written thereto and which is located close to the source line (ninth write). Then, the data in the lower page is written to the memory cell transistor MT (belonging to the word line WL3) located on the drain side of and adjacent to the memory cell transistor MT belonging to the word line WL2 and to which the data in the lower page has been written (tenth write). With the data in the upper page written to the memory cell transistor MT belonging to the word line WL1 and having the large AA width and with the data in the lower page written to the memory cell transistor MT belonging to the word line WL3 and having the large AA width, in the NAND columns 5 (belonging to AA1 and AA3) in which the memory cell transistors MT have the small AA width, the data in the upper page is written to the memory cell transistor (belonging to the word line WL1) which is included in the memory cell transistors MT with the data in the upper page not written thereto and which is located close to the source line (eleventh write). Then, the data in the lower page is written to the memory cell transistor MT (belonging to the word line WL3) located on the drain side of and adjacent to the memory cell transistor MT belonging to the word line WL2 and to which the data in the lower page has been written (twelfth write).

Thereafter, in a similar sequence, the memory cell transistors MT with the large AA width are preferentially programmed starting with the source-side one.

According to the modification of the second embodiment described above, the memory cell transistors MT with the large AA width are arranged alternately with the memory cell transistors MT with the small AA width, in the row direction as is the case with the above-described second embodiment.

The programming order is such that the memory cell transistor MT with the large AA width is programmed earlier than the memory cell transistor MT with the small AA width. That is, after the memory cell transistor MT with the large AA width is programmed (programming of the lower page or the upper page), programming of the memory cell transistor MT with the small AA width (programming of the lower page or the upper page) is performed.

Thus, as is the case with the above-described second embodiment, the inter-cell interference effect exerted on the memory cell transistors MT with the small AA width can be suppressed. Furthermore, the present modification enables a reduction in the inter-cell interference effect exerted on the memory cell transistors MT with the large AA width by the memory cell transistors MT with the small AA width. Thus, compared to the case where programming is performed regardless of the cell size, the present modification can suppress the inter-cell interference effect during programming.

(Third Embodiment)

Now, a third embodiment will be described with reference to FIG. 20. In the above-described first embodiment, the CG width of the memory cell transistor NT varies among the plurality of memory cell transistors MT along the column direction, and the memory cell transistors MT with the large CG width are preferentially programmed. Furthermore, in the above-described second embodiment, the AA width of the memory cell transistor MT varies among the plurality of memory cell transistors MT along the row direction, and the memory cell transistors MT with the large AA width are preferentially programmed. In the third embodiment, the CG width of the memory cell transistor NT varies among the plurality of memory cell transistors MT along the column direction, and the AA width of the memory cell transistor NT varies among the plurality of memory cell transistors MT along the row direction. The memory cell transistors MT with the large CG or AA width are preferentially programmed. The CG width corresponds to the gate length of the memory cell transistor MT. The AA width corresponds to the gate width of the memory cell transistor MT.

Figure 20:
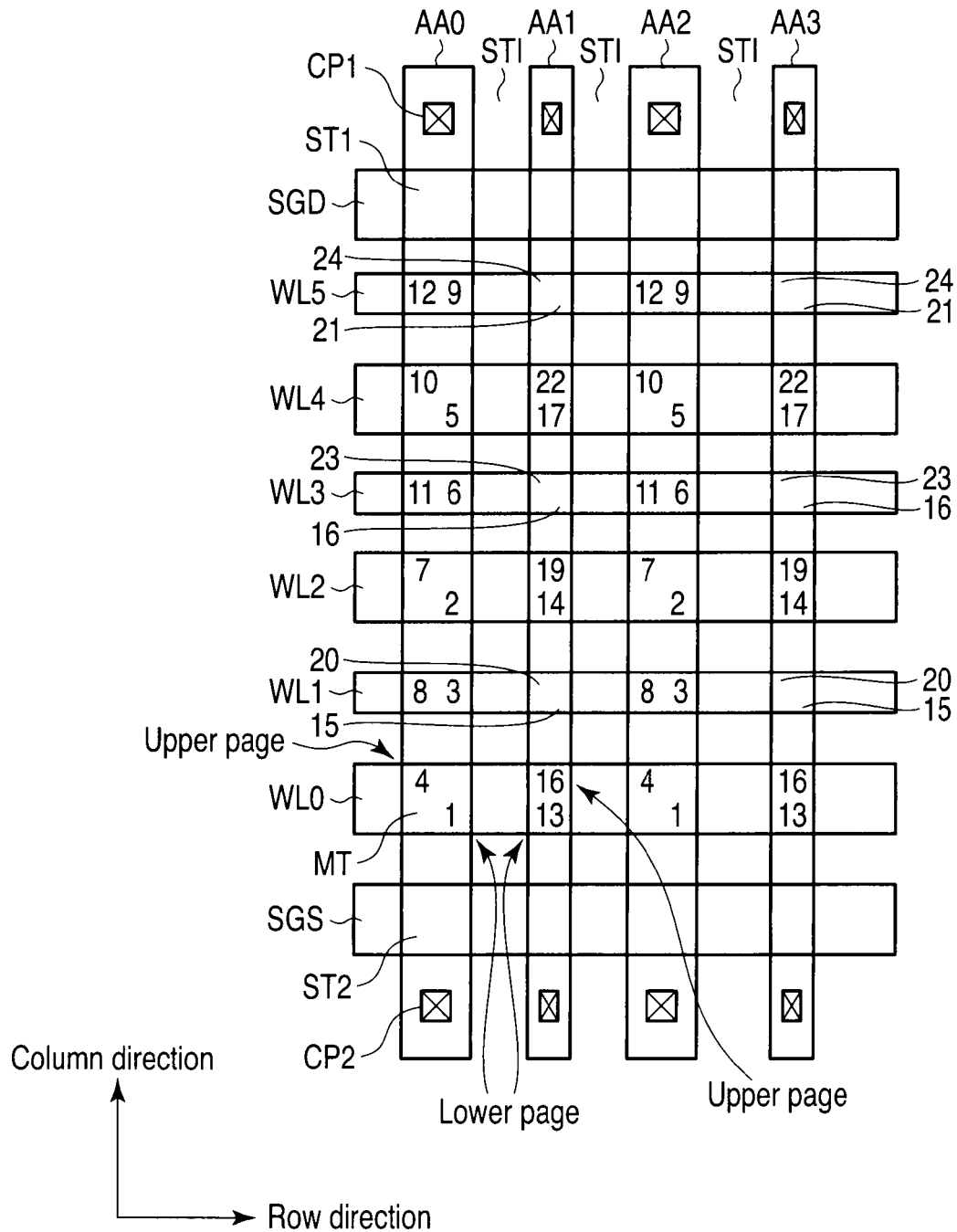
FIG. 20 is a plan view schematically showing a basic programming order for a NAND nonvolatile semiconductor memory device according to a third embodiment.

FIG. 20 is a plan view schematically showing a basic programming order for a NAND nonvolatile semiconductor memory device according to the third embodiment. The basic configuration of the NAND nonvolatile semiconductor memory device is similar to that in the above-described comparative example and first and second embodiments. Thus, matters described above in the comparative example and first and second embodiments as well as matters that can be easily analogized from the comparative example and first and second embodiments will not be described below.

As shown in FIG. 20, in the column direction, the memory cell transistor MT located at the intersection between AA and each of word lines WL0, WL2, WL4, . . . , has a larger CG width than that located at the intersection between AA and each of the word lines WL1, WL3, WL5, . . . . That is, in the column direction, the thick memory cell transistors MT and the thin memory cell transistors MT are alternately (periodically) arranged. Furthermore, in the row direction, the memory cell transistor MT located at the intersection between the word line WL and each of AA0 and AA2 has a larger AA width than that located at the intersection between the word line and each of AA1 and AA3. That is, in the row direction, the thick memory cell transistors MT and the thin memory cell transistors MT are alternately (periodically) arranged. For simplification, each NAND column is assumed to comprise six memory cell transistors MT, and only four NAND columns 5 are shown.

Furthermore, as is the case with the first embodiment, before programming, a write pulse is applied to all the memory cell transistors. The threshold of each memory cell transistor is then read and stored in a storage circuit 7 as dimensional information on the memory cell transistor MT. Based on the dimensional information on the memory cell transistors MT, the programming order for a memory cell array 1 is determined.

In the NAND nonvolatile semiconductor memory device, programming is sequentially performed from the source-side memory cell transistor MT toward the drain-side memory cell transistor MT. The programming order is determined based on the dimensional information on the memory cell transistors MT stored in the storage circuit 7. In FIG. 20, the right or lower number in the memory cell transistor MT indicates a turn programming a lower page. The left or upper number in the memory cell transistor MT indicates a turn programming an upper page.

First, in the row direction, a programming method similar to that described above in the first embodiment is used for the NAND columns 5 (belonging to AA0 and AA2) in which the memory cell transistors MT have the large AA width. After programming of the memory cell transistor MT belonging to the word line WL5 is completed, a programming method similar to that described above in the first embodiment is used for the NAND columns 5 (belonging to AA1 and AA3) in which the memory cell transistors have the large AA width.

According to the above-described third embodiment, in the row direction, the memory cell transistors MT with the large AA width are arranged alternately with the memory cell transistors MT with the small AA width. In the column direction, the memory cell transistors MT with the large CG width are arranged alternately with the memory cell transistors MT with the small CG width.

The programming order is such that the thick memory cell transistor MT is programmed earlier than the thin memory cell transistor MT. That is, after the thick memory cell transistor MT is programmed (programming of the lower page and the upper page), programming of the thin memory cell transistor MT (programming of the lower page and the upper page) is performed. Specifically, in the NAND column 5 in which the memory cell transistors MT are thick in the row direction, as is the case with the first embodiment, write starts to be carried out on the source-side thick memory cell transistor MT. Write is then carried out on the memory cell transistor MT closest to the source side next to the thick memory cell transistor on which the write has been carried out. Then, write is executed on the thin memory cell transistor sandwiched between the thick memory cell transistors on which the write has been carried out.

With the programming of the NAND column 5 completed as described above, in the NAND column 5 in which the memory cell transistors MT are thin in the row direction, as is the case with the first embodiment, write starts to be carried out on the source-side thick memory cell transistor MT. Write is then carried out on the memory cell transistor MT closest to the source side next to the thick memory cell transistor on which the write has been carried out. Then, write is executed on the thin memory cell transistor sandwiched between the thick memory cell transistors on which the write has been carried out.

Thus, the inter-cell interference effect exerted on the thin memory cell transistor MT can be suppressed. Furthermore, the present embodiment enables a reduction in the inter-cell interference effect exerted on the thick memory cell transistors MT by the thin memory cell transistors MT. Thus, compared to the case where programming is performed regardless of the cell size, the present embodiment can suppress the inter-cell interference effect during programming.

(Modification)

Now, a modification of the third embodiment will be described with reference to FIG. 21.

Figure 21:
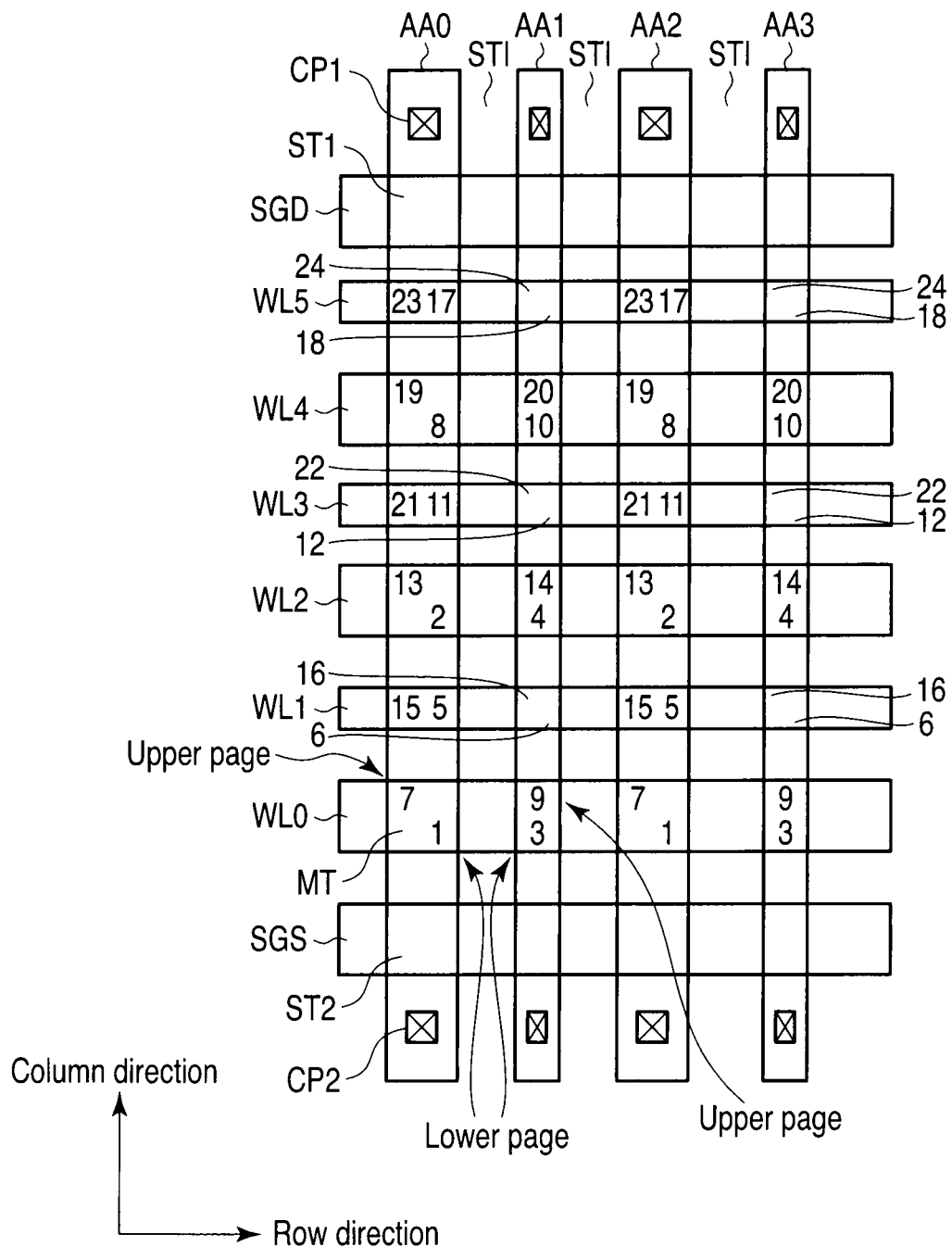
FIG. 21 is a plan view schematically showing a basic programming order for a NAND nonvolatile semiconductor memory device according to a modification of the third embodiment.

FIG. 21 is a plan view schematically showing a basic programming order for a NAND nonvolatile semiconductor memory device according to the modification of the third embodiment. The basic configuration of the NAND nonvolatile semiconductor memory device is similar to that in the above-described comparative example and first, second, and third embodiments. Thus, matters described above in the comparative example and first, second, and third embodiments as well as matters that can be easily analogized from the comparative example and first, second, and third embodiments will not be described below.

As shown in FIG. 21, in the column direction, the memory cell transistor MT located at the intersection between AA and each of word lines WL0, WL2, and WL4 has a larger CG width than that located at the intersection between AA and each of the word lines WL1, WL3, and WL5. That is, in the column direction, the memory cell transistors MT with the large CG width are arranged alternately (periodically) with the memory cell transistors MT with the small CG width. Furthermore, in the row direction, the memory cell transistor MT located at the intersection between the word line WL and each of AA0 and AA2 has a larger AA width than that located at the intersection between the word line and each of AA1 and AA3. That is, in the row direction, the memory cell transistors MT with the large AA width are arranged alternately (periodically) with the memory cell transistors MT with the small AA width. For simplification, each NAND column 5 is assumed to comprise six memory cell transistors MT, and only four NAND columns 5 are shown.

Furthermore, as is the case with the first embodiment, before programming, a write pulse is applied to all the memory cell transistors. The threshold of each memory cell transistor is then read and stored in the storage circuit 7 as dimensional information on the memory cell transistor MT. Based on the dimensional information on the memory cell transistors MT, the programming order for the memory cell array 1 is determined.

In the NAND nonvolatile semiconductor memory device, programming is sequentially performed from the source-side memory cell transistor MT toward the drain-side memory cell transistor MT. The programming order is determined based on the dimensional information on the memory cell transistors MT stored in the storage circuit 7. In FIG. 21, the right or lower number in the memory cell transistor MT indicates a turn programming a lower page. The left or upper number in the memory cell transistor MT indicates a turn programming an upper page.

First, in the NAND columns 5 (belonging to AA0 and AA2) in which the memory cell transistors MT have the large AA width, the data in the lower page is written to the memory cell transistor MT (belonging to the word line WL0) having the large CG width and located closest to the source line side (first write). Then, the data in the lower page is written to the memory cell transistor MT (belonging to the word line WL2) having the large CG width and to which the data in the lower page has not been written and which is located on the drain side of and adjacent to the memory cell transistor MT (belonging to the word line WL1) having the small CG width and to which the data in the lower page has not been written and which is located on the drain side of and adjacent to the memory cell transistor MT belonging to the word line WL0 and to which the data in the lower page has been written (second write). With the data in the lower page written to the memory cell transistors MT belonging to the word lines WL0 and WL2 and having the large AA width and the large CG width, in the NAND columns 5 (belonging to AA1 an AA3) in which the memory cell transistors MT have the small AA width, the data in the lower page is written to the memory cell transistor MT (belonging to the word line WL0) and having the large CG width and located closest to the source line (third write). Then, the data in the lower page is written to the memory cell transistor MT (belonging to the word line WL2) having the large CG width and to which the data in the lower page has not been written and which is located on the drain side of and adjacent to the memory cell transistor MT (belonging to the word line WL1) having the small CG width and to which the data in the lower page has not been written and which is located on the drain side of and adjacent to the memory cell transistor MT belonging to the word line WL0 and to which the data in the lower page has been written (fourth write).

Then, with the lower page written to the memory cell transistor MT belonging to the word line WL2 and having the large AA width and the large CG width, in the NAND columns 5 (belonging to AA0 an AA2) in which the memory cell transistors MT have the large AA width, the data in the lower page is written to the memory cell transistor MT belonging to the word line WL1 and having the small CG width and to which the data in the lower page has not been written and which is located between the memory cell transistors belonging to the word lines WL0 and WL2, respectively (fifth write). Then, with the lower page written to the memory cell transistor MT belonging to the word line WL1 and having the large AA width and the small CG width, in the NAND columns 5 (belonging to AA1 an AA3) in which the memory cell transistors MT have the small AA width, the data in the lower page is written to the memory cell transistor MT belonging to the word line WL1 and having the small CG width and to which the data in the lower page has not been written and which is located between the memory cell transistors belonging to the word lines WL0 and WL2, respectively (sixth write).

Then, with the lower page written to the memory cell transistor MT belonging to the word line WL1 and having the small AA width and the small CG width, in the NAND columns 5 (belonging to AA0 an AA2) in which the memory cell transistors MT have the large AA width, the data in the upper page is written to the memory cell transistor MT (belonging to the word line WL0) located close to the source line and included in the memory cell transistors MT having the large CG width and to which the data in the upper page has not been written (seventh write). Then, the data in the lower page is written to the memory cell transistor MT (belonging to the word line WL4) having the large CG width and to which the data in the lower page has not been written and which is located on the drain side of and adjacent to the memory cell transistor MT (belonging to the word line WL3) having the small CG width and to which the data in the lower page has not been written and which is located on the drain side of and adjacent to the memory cell transistor MT belonging to the word line WL2 and to which the lower page data has been written (eighth write).

Then, with the lower page written to the memory cell transistor MT belonging to the word line WL4 and having the large AA width and the large CG width, in the NAND columns 5 (belonging to AA1 an AA3) in which the memory cell transistors MT have the small AA width, the data in the upper page is written to the memory cell transistor MT (belonging to the word line WL0) located close to the source line and included in the memory cell transistors MT having the large CG width and to which the data in the upper page has not been written (ninth write). Then, the data in the lower page is written to the memory cell transistor MT (belonging to the word line WL4) having the large CG width and to which the data in the lower page has not been written and which is located on the drain side of and adjacent to the memory cell transistor MT (belonging to the word line WL3) having the small CG width and to which the data in the lower page has not been written and which is located on the drain side of and adjacent to the memory cell transistor MT belonging to the word line WL2 and to which the lower page data has been written (tenth write).

Then, with the lower page written to the memory cell transistor MT belonging to the word line WL4 and having the small AA width and the large CG width, in the NAND columns 5 (belonging to AA0 an AA2) in which the memory cell transistors MT have the large AA width, the data in the lower page is written to the memory cell transistor MT belonging to the word line WL3 and having the small CG width and to which the data in the lower page has not been written and which is located between the memory cell transistors MT belonging to the word lines WL2 and WL4, respectively (eleventh write). Then, with the lower page written to the memory cell transistor MT belonging to the word line WL3 and having the large AA width and the small CG width, in the NAND columns 5 (belonging to AA1 an AA3) in which the memory cell transistors MT have the small AA width, the data in the lower page is written to the memory cell transistor MT belonging to the word line WL3 and having the small CG width and to which the data in the lower page has not been written and which is located between the memory cell transistors belonging to the word lines WL2 and WL4, respectively (twelfth write).

Then, with the lower page written to the memory cell transistor MT belonging to the word line WL3 and having the small AA width and the small CG width, in the NAND columns 5 (belonging to AA0 an AA2) in which the memory cell transistors MT have the large AA width, the data in the upper page is written to the memory cell transistor MT (belonging to the word line WL2) located close to the source line and included in the memory cell transistors MT having the large CG width and to which the data in the upper page has not been written (thirteenth write). With the upper page written to the memory cell transistor MT belonging to the word line WL2 and having the large AA width and the large CG width, in the NAND columns 5 (belonging to AA1 an AA3) in which the memory cell transistors MT have the small AA width, the data in the upper page is written to the memory cell transistor MT (belonging to the word line WL2) located close to the source line and included in the memory cell transistors MT having the large CG width and to which the data in the upper page has not been written (fourteenth write).

Then, with the upper page written to the memory cell transistor MT belonging to the word line WL2 and having the small AA width and the large CG width, in the NAND columns 5 (belonging to AA0 an AA2) in which the memory cell transistors MT have the large AA width, the data in the upper page is written to the memory cell transistor MT belonging to the word line WL1 and having the small CG width and to which the data in the lower page has not been written and which is located between the memory cell transistors belonging to the word lines WL2 and WL4, respectively, and to which the data in the upper page has been written (fifteenth write). Then, with the upper page written to the memory cell transistor MT belonging to the word line WL1 and having the large AA width and the small CG width, in the NAND columns 5 (belonging to AA1 an AA3) in which the memory cell transistors MT have the small AA width, the data in the upper page is written to the memory cell transistor MT belonging to the word line WL1 and having the small CG width and to which the data in the upper page has not been written and which is located between the memory cell transistors belonging to the word lines WL0 and WL2, respectively (sixteenth write).

Thereafter, in a similar sequence, the memory cell transistors MT with the large AA width and the large CG width are preferentially programmed starting with the source-side one.

According to the modification of the third embodiment described above, in the row direction, the memory cell transistors MT with the large AA width are arranged alternately with the memory cell transistors MT with the small AA width. Moreover, in the column direction, the memory cell transistors MT with the large CG width are arranged alternately with the memory cell transistors MT with the small CG width.

The programming order is such that the memory cell transistor MT with the large AA or CG width is programmed earlier than the memory cell transistor MT with the small AA or CG width. That is, in a plurality of memory cell transistors MT adjacent to one another in the row or column direction, after the memory cell transistor MT with the large AA or CG width is programmed (programming of the lower page or the upper page), programming of the memory cell transistor MT with the small AA or CG width (programming of the lower page or the upper page) is performed.

Thus, as is the case with the above-described embodiments, the inter-cell interference effect exerted on the thin memory cell transistor MT can be suppressed. Furthermore, the present modification enables a reduction in the inter-cell interference effect exerted on the thick memory cell transistors MT by the thin memory cell transistors MT. Thus, compared to the case where programming is performed regardless of the cell size, the present embodiment can suppress the inter-cell interference effect during programming.

The wide and narrow memory cell transistors MT may be optionally arranged provided that the programming order is such that after the data in the lower or upper page is written to the wide memory cell transistor MT, the data in the lower or upper page is written to the adjacent, narrow memory cell transistor MT. Furthermore, in the above-described embodiments, the LM scheme is used. However, the write order according to each of the embodiments us applicable to any method other than the LM scheme.

In the above-described first embodiment, the basic method for manufacturing NAND nonvolatile semiconductor memory device has been described. However, the above-described embodiments are not limited to this method. Any method is applicable provided that wide and narrow memory cell transistors MT are formed.

Furthermore, in the above-described embodiments, polysilicon is used as the charge accumulation layer in the memory cell transistor MT. However, a charge-accumulating insulating layer may be used. In this case, an inter-electrode insulating film serves as a block insulating film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A NAND nonvolatile semiconductor memory device comprising:
   a plurality of memory cell transistors arranged in a matrix in a column direction and a row direction and each comprising a charge accumulation layer and a control gate electrode configured to control a charge accumulation state of the charge accumulation layer; and
   a write circuit configured to carry out write on the plurality of memory cell transistors,
   wherein the memory cell transistors arranged in the same column include first memory cell transistors, and second memory cell transistors each of which is smaller in size than the first memory cell transistor in the column direction,
   the write circuit carries out write on a predetermined first memory cell transistor and then on another first memory cell transistor, and after the write on the another first memory cell transistor, carries out write on the second memory cell transistor,
   wherein the memory cell transistors arranged in the same row include the first memory cell transistors, and third memory cell transistors each of which is smaller in size than the first memory cell transistor in the row direction, and the memory cell transistors arranged in a column different from the one in which the first and second memory cell transistors are arranged include the third memory cell transistors and fourth memory cell transistors each of which is smaller in size than the third memory cell transistor in the column direction, and
   the write circuit carries out write on the third first memory cell transistor after the write on the predetermined memory cell transistor, and after the write on the third memory cell transistor and the second memory cell transistor, carries out write on the fourth memory cell transistor.

2. The device of claim 1, wherein after the write on the predetermined first memory cell transistor the write circuit carries out write on the third memory cell transistor which is adjacent to the predetermined first memory cell transistor.

3. The device of claim 2, wherein after the write on the second memory cell transistor the write circuit carries out write on the fourth memory cell transistor which is adjacent to the second memory cell transistor.

4. The device of claim 1, wherein the write circuit detects the size of each of the memory cell transistors based on a write characteristic of the memory cell transistors.

5. The device of claim 4, wherein the write circuit comprises a circuit configured to store information on the detected size of each of the memory cell transistors.

6. The device of claim 1, wherein the write circuit carries out write on the another first memory cell transistor, and then on the second memory cell transistor located between the predetermined first memory cell transistor and the another first memory cell transistor.

7. The device of claim 6, wherein the first memory cell transistor and second memory cell transistor are alternately arranged in the column direction.

8. A write method for a NAND nonvolatile semiconductor memory device comprising a plurality of memory cell transistors arranged in a matrix in a column direction and a row direction and each comprising a charge accumulation layer and a control gate electrode configured to control a charge accumulation state of the charge accumulation layer, the method comprising:
   carrying out write on a predetermined first memory cell transistor;
   after the write on the predetermined first memory cell transistor, carrying out write on another first memory cell transistor located in the same column in which the predetermined first memory cell transistor is located;
   after the write on the another first memory cell transistor, carrying out write on a second memory cell transistor located in the same column in which the predetermined first memory cell transistor is located and which is smaller in size than each of the first memory cell transistors in the column direction,
   wherein after the write on the first memory cell transistors, write is carried out on third memory cell transistors located in the same row in which the first memory cell transistors are located, the third memory cell transistors being smaller in size than each of the first memory cell transistors in the row direction, and after the write on the third memory cell transistors and the second memory cell transistor, write is carried out on a fourth memory cell transistor located in the same column in which the third memory cell transistors are located, the fourth memory cell transistor being smaller in size than each of the third memory cell transistors in the column direction.

9. The method of claim 8, wherein after the write on the another first memory cell transistor, write is carried out on the third memory cell transistor which is adjacent to the predetermined first memory cell transistor.

10. The method of claim 9, wherein after the write on the second memory cell transistor, write is carried out on the fourth memory cell transistor which is adjacent to the second memory cell transistor.

11. The method of claim 8, further comprising detecting the size of each of the memory cell transistors based on a write characteristic of the memory cell transistors.

12. The method of claim 11, further comprising storing information on the detected size of each of the memory cell transistors.

13. The method of claim 8, wherein after the write on the another first memory cell transistor, write is carried out on the second memory cell transistor located between the predetermined first memory cell transistor and the another first memory cell transistor.

* * * * *